United States Patent
Nielsen

(10) Patent No.: US 11,876,499 B2
(45) Date of Patent: Jan. 16, 2024

(54) TUNABLE BANDPASS FILTER WITH HIGH STABILITY AND ORTHOGONAL TUNING

(71) Applicant: Anlotek Limited, London (GB)

(72) Inventor: Jorgen Staal Nielsen, Calgary (CA)

(73) Assignee: Anlotek Limited, London (GB)

( * ) Notice: Subject to any disclaimer, the term of this patent is extended or adjusted under 35 U.S.C. 154(b) by 214 days.

(21) Appl. No.: 17/348,556

(22) Filed: Jun. 15, 2021

(65) Prior Publication Data
US 2021/0391849 A1 Dec. 16, 2021

Related U.S. Application Data

(60) Provisional application No. 63/039,076, filed on Jun. 15, 2020.

(51) Int. Cl.
| | | |
|---|---|---|
| H03H 11/00 | (2006.01) | |
| H03H 11/12 | (2006.01) | |
| H03H 7/01 | (2006.01) | |

(52) U.S. Cl.
CPC ...... *H03H 11/1208* (2013.01); *H03H 7/0161* (2013.01); *H03H 11/1291* (2013.01); *H03H 2210/015* (2013.01)

(58) Field of Classification Search
CPC ...... H03H 11/00; H03H 11/1208; H03H 7/00; H03H 7/0153; H03H 7/0161
(Continued)

(56) References Cited

U.S. PATENT DOCUMENTS

| | | |
|---|---|---|
| 1,570,771 A | 1/1926 | Nyquist |
| 1,778,085 A | 10/1930 | Nyquist |

(Continued)

FOREIGN PATENT DOCUMENTS

| | | |
|---|---|---|
| CN | 102098018 A | 6/2011 |
| CN | 104538714 A | 4/2015 |

(Continued)

OTHER PUBLICATIONS

Anis, M., et al., "Fully Integrated Super-Regenerative Bandpass Filters for 3.1-to-7GHz Multiband UWB System," Proceedings of the IEEE International Symposium on VLSI Design, Automation and Test (VLSI-DAT), Apr. 23-25, 2008, Hsinchu, Taiwan, 4 pages.

(Continued)

*Primary Examiner* — Hai L Nguyen
(74) *Attorney, Agent, or Firm* — CHRISTENSEN O'CONNOR JOHNSON KINDNESS PLLC

(57) ABSTRACT

A method of stabilizing a variable filter for an analog electromagnetic signal against circuit oscillation includes the steps of: providing a signal loop comprising a signal input, a signal output, and a plurality of variable circuit elements connected in the signal loop, the plurality of variable circuit elements comprising an adjustable resonator and an adjustable gain block, the signal loop having a variable frequency response that is characterized by a central frequency, a frequency passband, a response Q, and an operating point and a resonator response curve that are plottable in a Cartesian s-plane having an origin, a real axis, and an imaginary axis; and maintaining stability of the variable filter within an operating range by controlling the adjustable resonator and the adjustable gain block such that, in the Cartesian s-plane, the resonator response curve satisfies an orthogonality stability condition.

18 Claims, 18 Drawing Sheets

(58) Field of Classification Search
USPC .................................. 327/552, 553, 557
See application file for complete search history.

(56) References Cited

U.S. PATENT DOCUMENTS

| | | |
|---|---|---|
| 1,915,440 A | 6/1933 | Nyquist |
| 1,926,169 A | 9/1933 | Nyquist |
| 2,099,769 A | 11/1937 | Nyquist |
| 3,720,881 A | 3/1973 | Hurtig, III |
| 5,220,686 A | 6/1993 | Kasperkovitz et al. |
| 5,291,159 A | 3/1994 | Vale |
| 5,311,198 A | 5/1994 | Sutton |
| 5,854,593 A | 12/1998 | Dykema et al. |
| 5,917,387 A | 6/1999 | Rice et al. |
| 5,949,290 A | 9/1999 | Bertram |
| 6,057,735 A | 5/2000 | Cloutier |
| 6,236,281 B1 | 5/2001 | Nguyen et al. |
| 6,420,913 B1 | 7/2002 | Freeman |
| 6,452,465 B1 | 9/2002 | Brown et al. |
| 6,496,075 B2 | 12/2002 | Justice et al. |
| 6,587,007 B2 | 7/2003 | Exeter |
| 6,650,195 B1 | 11/2003 | Brunn et al. |
| 6,771,147 B2 | 8/2004 | Mongia |
| 6,865,387 B2 | 3/2005 | Bucknell et al. |
| 6,898,450 B2 | 5/2005 | Eden et al. |
| 6,920,315 B1 | 7/2005 | Wilcox et al. |
| 6,937,877 B2 | 8/2005 | Davenport |
| 6,941,118 B2 | 9/2005 | Yamamoto |
| 6,954,774 B1 | 10/2005 | Mulbrook |
| 7,098,751 B1 | 8/2006 | Wong |
| 7,151,925 B2 | 12/2006 | Ting et al. |
| 7,158,010 B2 | 1/2007 | Fischer et al. |
| 7,174,147 B2 | 2/2007 | Toncich et al. |
| 7,346,330 B2 | 3/2008 | Kawabe et al. |
| 7,400,203 B2 | 7/2008 | Ojo et al. |
| 7,414,779 B2 | 8/2008 | Huber et al. |
| 7,423,502 B2 | 9/2008 | Razafimandimby et al. |
| 7,433,668 B2 | 10/2008 | Fischer et al. |
| 7,509,141 B1 | 3/2009 | Koenck et al. |
| 7,522,016 B2 | 4/2009 | Toncich et al. |
| 7,809,410 B2 | 10/2010 | Palum et al. |
| 7,917,117 B2 | 3/2011 | Zafonte |
| 7,937,076 B2 | 5/2011 | Zeller et al. |
| 8,000,379 B2 | 8/2011 | Kishigami et al. |
| 8,050,708 B2 | 11/2011 | March et al. |
| 8,103,213 B2 | 1/2012 | Tolonen |
| 8,106,727 B2 | 1/2012 | Kawai et al. |
| 8,107,939 B2 | 1/2012 | Hassan et al. |
| 8,120,536 B2 | 2/2012 | Lindmark |
| 8,140,033 B2 | 3/2012 | Chan Wai Po et al. |
| 8,253,514 B2 | 8/2012 | Kharrat et al. |
| 8,294,537 B2 | 10/2012 | Kawai et al. |
| 8,565,671 B2 | 10/2013 | Robert et al. |
| 8,767,871 B2 | 7/2014 | Park et al. |
| 8,922,294 B2 | 12/2014 | Tsuzuki et al. |
| 8,981,875 B2 | 5/2015 | Park |
| 9,024,709 B2 | 5/2015 | Joshi et al. |
| 9,083,351 B1 | 7/2015 | Lee et al. |
| 9,129,080 B2 | 9/2015 | Tsuzuki et al. |
| 9,184,498 B2 | 11/2015 | Schiller |
| 9,231,712 B2 | 1/2016 | Hahn et al. |
| 9,407,239 B2 | 8/2016 | White et al. |
| 9,634,390 B2 | 4/2017 | Onaka |
| 9,641,138 B2 | 5/2017 | Zhu |
| 9,698,747 B2 | 7/2017 | Ishizuka |
| 10,050,604 B2 * | 8/2018 | Nielsen ............ H03G 3/3042 |
| 10,228,927 B2 | 3/2019 | Choi et al. |
| 10,236,899 B1 | 3/2019 | Tope et al. |
| 10,396,807 B1 | 8/2019 | Dai et al. |
| 10,879,875 B2 * | 12/2020 | Nielsen ............ H03G 3/3042 |
| 11,277,110 B2 * | 3/2022 | Nielsen ............ H03G 3/3052 |
| 11,290,084 B2 * | 3/2022 | Nielsen ............ H03H 9/545 |
| 2001/0043116 A1 | 11/2001 | Waltman |
| 2004/0030108 A1 | 2/2004 | Pihlava et al. |
| 2005/0003785 A1 | 1/2005 | Jackson et al. |
| 2007/0010217 A1 | 1/2007 | Takahashi et al. |
| 2007/0195915 A1 | 8/2007 | Ko et al. |
| 2007/0296513 A1 | 12/2007 | Ruile et al. |
| 2009/0322445 A1 | 12/2009 | Raidl et al. |
| 2010/0097152 A1 | 4/2010 | Wang et al. |
| 2010/0141355 A1 | 6/2010 | Kharrat et al. |
| 2011/0002080 A1 | 1/2011 | Ranta |
| 2011/0187448 A1 | 8/2011 | Koechlin |
| 2013/0065542 A1 | 3/2013 | Proudkii |
| 2013/0142089 A1 | 6/2013 | Azarnaminy et al. |
| 2013/0293291 A1 | 11/2013 | Shanan |
| 2014/0266454 A1 | 9/2014 | Testi et al. |
| 2014/0361839 A1 | 12/2014 | Scott et al. |
| 2016/0072442 A1 | 3/2016 | Testi et al. |
| 2016/0164481 A1 | 6/2016 | Madan et al. |
| 2017/0149411 A1 | 5/2017 | Nielsen et al. |
| 2020/0014382 A1 | 1/2020 | Ranta |
| 2021/0067125 A1 | 3/2021 | Nielsen |

FOREIGN PATENT DOCUMENTS

| | | |
|---|---|---|
| CN | 108463949 B | 7/2022 |
| EP | 1675263 A1 | 6/2006 |
| EP | 3062442 A1 | 8/2016 |
| GB | 2 403 086 A | 12/2004 |
| GB | 2 478 585 A | 9/2011 |
| GB | 2 494 652 A | 3/2013 |
| WO | 01/89081 A2 | 11/2001 |
| WO | 02/087071 A2 | 10/2002 |
| WO | 2009114123 A2 | 9/2009 |
| WO | 2011/103108 A1 | 8/2011 |
| WO | 2015/176041 A1 | 11/2015 |
| WO | 2018/215973 A1 | 11/2018 |

OTHER PUBLICATIONS

Anis, M., et al., "Low Power Complementary Colpitts Self-Quenched Super-Regenerative Ultra-Wideband (UWB) Bandpass Filter in CMOS Technology," Proceedings of the IEEE MTT-S International Microwave Symposium Digest, Jun. 15-20, 2008, Atlanta, pp. 1047-1049.

Bahl, I.J., "High-Performance Inductors," IEEE Transactions on Microwave Theory and Techniques 49(4):654-664, Apr. 2001.

Bhattacharya, A., et al., "A 1.3-2.4 GHz 3.1-mW VCO Using Electro-Thermo-Mechanically Tunable Self-Assembled MEMS Inductor on HR Substrate," IEEE Transactions on Microwave Theory and Techniques 63(2):459-469, Feb. 2015.

Chen, J.-Y., et al., "A Fully Integrated Auto-Calibrated Super-Regenerative Receiver in 0.13-μm CMOS," IEEE Journal of Solid-State Circuits 42(9):1976-1985, Sep. 2007.

Chen, Y.-M., et al., "A 1-1.5 GHz Broadband Tunable Bandpass Filter," Proceedings of the Asia-Pacific Microwave Conference (APMC), Kaohsiung, Taiwan, Dec. 4-7, 2012, pp. 738-740.

Duncan, R., et al., "A Q-Enhanced Active-RLC Bandpass Filter," IEEE Transactions on Circuits and Systems—II: Analog and Digital Signal Processing 44(5):341-347, May 1997.

Entesari, K., et al., "A 25-75-MHz RF MEMS Tunable Filter," IEEE Transactions on Microwave Theory and Techniques 55(11):2399-2405, Nov. 2007.

Frey, D.R., "Improved Super-Regenerative Receiver Theory," IEEE Transactions on Circuits and Systems—I: Regular Papers 60(12):3267-3278, Dec. 2013.

Georgescu, B., et al., "Tunable Coupled Inductor Q-Enhancement for Parallel Resonant LC Tanks," IEEE Transactions on Circuits and Systems—II: Analog and Digital Signal Processing 50(10):705-713, Oct. 2003.

Golaszewski, A., and A. Abramowicz, "Voltage Tunable Bandpass Filter," Proceedings of the Signal Processing Symposium (SPSympo), Debe, Poland, Jun. 10-12, 2015, 4 pages.

Guyette, A.C., "Alternative Architectures for Narrowband Varactor-Tuned Bandpass Filters," Proceedings of the European Microwave Conference (EuMC), Rome, Sep. 29-Oct. 1, 2009, pp. 1828-1831.

He, X., and W.B. Kuhn, "A Fully Integrated Q-Enhanced LC Filter With 6 dB Noise Figure at 2.5 GHz in SOI," Proceedings of the

(56) References Cited

OTHER PUBLICATIONS

IEEE Radio Frequency Integrated Circuits (RFIC) Symposium, Fort Worth, Texas, Jun. 6-8, 2004, pp. 643-646.
International Search Report and Written Opinion dated Feb. 8, 2017, issued in corresponding International Application No. PCT/GB2016/053686, filed Nov. 23, 2016, 10 pages.
Kuhn, W.B., et al., "Q-Enhanced LC Bandpass Filters for Integrated Wireless Applications," IEEE Transactions on Microwave Theory and Techniques 46(12):2577-2586, Dec. 1998.
Luo, X., et al., "Tunable Bandpass Filter With Two Adjustable Transmission Poles and Compensable Coupling," IEEE Transactions on Microwave Theory and Techniques 62(9):2003-2013, Sep. 2014.
Nosrati, M., and Z. Atlasbaf, "A New Miniaturized Electronically Tunable Bandpass Filter," Proceedings of the Seventh International Symposium on Antennas, Propagation & EM Theory (ISAPE '06), Guilin, China, Oct. 26-29, 2007, 5 pages.
Piazza, G., "MEMS Resonators for Frequency Control and Sensing Applications," presentation, University of Pennsylvania, Philadelphia [at least as early as Apr. 24, 2015], 104 pages.
Psychogiou, D., et al., "V-Band Bandpass Filter With Continuously Variable Centre Frequency," IET Microwaves, Antennas & Propagation 7(8):701-707, Jun. 2013.
Quednau, P., et al., "A Small Size Low Cost Electronically Tunable Bandpass Filter With Integrated Bias Control," Proceedings of the IEEE International Conference on Microwaves, Communications, Antennas and Electronic Systems (COMCAS), Tel Aviv, Israel, Oct. 21-23, 2013, 4 pages.
Ramadan, A.H., et al., "A Narrowband Frequency-Tunable Antenna for Cognitive Radio Applications," Proceedings of the Sixth European Conference on Antennas and Propagation (EuCAP), Mar. 26-30, 2012, Prague, 5 pages.
Ramadan, A.H., et al., "A Tunable Filtenna for Cognitive Radio Applications," Proceedings of the Ninth European Conference on Antennas and Propagation (EuCAP), Apr. 13-17, 2015, Lisbon, Portugal, 2 pages.
Soorapanth, T., and S.S. Wong, "A 0-dB IL 2140 ± 30 MHz Bandpass Filter Utilizing Q-Enhanced Spiral Inductors in Standard CMOS," IEEE Journal of Solid-State Circuits 37(5):579-586, May 2002.
Sunca, A., et al., "A Wide Tunable Bandpass Filter Design Based on CMOS Active Inductor," Proceedings of the Eighth Conference on Ph.D. Research in Microelectronics and Electronics (PRIME), Session TF3—Microwave and RF, Aachen, Germany, Jun. 12-15, 2012, pp. 203-206.
Wang, S., and R.-X. Wang, "A Tunable Bandpass Filter Using Q-Enhanced and Semi-Passive Inductors at S-Band in 0.18-μM CMOS," Progress in Electromagnetics Research B 28:55-73, 2011.
Written Opinion of the International Preliminary Examining Authority dated Feb. 5, 2018, issued in corresponding International Application No. PCT/GB2016/053686, filed Nov. 23, 2016, 6 pages.
He, X., and W.B. Kuhn, "A 2.5-GHz Low-Power, High Dynamic Range, Self-Tuned Q-Enhanced LC Filter in SOI," IEEE Journal of Solid-State Circuits, vol. 40, No. 8, Aug. 2005, 1618-1628.
Gao, W. and W.S. Snelgrove, "A 950MHz Second-Order Integrated LC Bandpass Modulator" 1997 Symposium on VLSI Circuits Digest of Technical Papers, p. 111-112.
Zumbahlen, Hank: "Chapter 5: Analog Filters ; Section 5-6: Filter Realizations" In: "Op Amp Applications Handbook". Dec. 31, 2005, Newnes, Oxford, p. 5.59-5.100.
Deliyannis, Theodore L, et al.: "5.6 Multiple-Loop Feedback Filters" In: "Continuous-Time Active Filter Design." Jan. 1, 1999, Boca Raton, FL: CRC Press, US 028016 pp. 162-171.

* cited by examiner

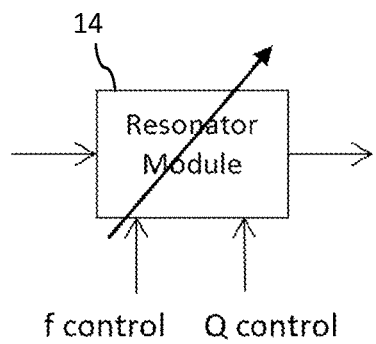
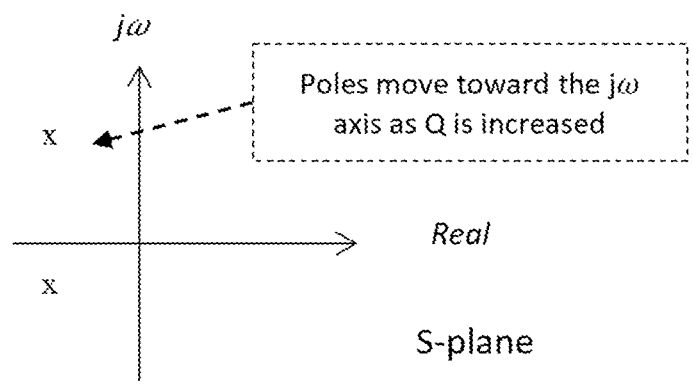
FIG. 1a                    FIG. 1b
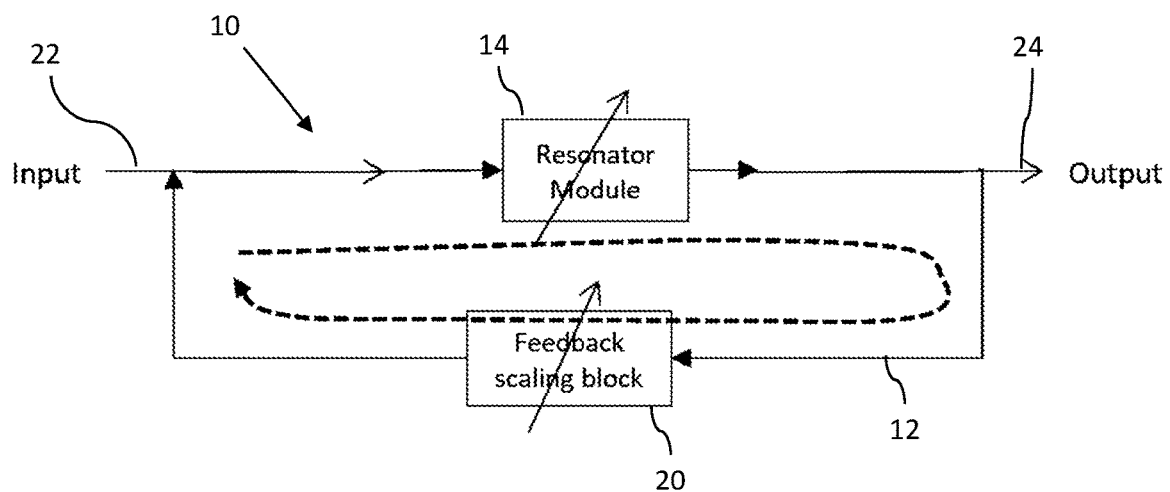
FIG. 2

TUNABLE BANDPASS FILTER WITH HIGH STABILITY AND ORTHOGONAL TUNING

TECHNICAL FIELD

This relates a method and apparatus to control a variable filter such as an active feedback variable filter, and in particular, maintaining the stability of the variable filter.

BACKGROUND

An Active Feedback Bandpass Filter (AFBF) has historically been based on a single resonator feedback (SRF) design since the initial development back in the 1920s. The lack of stability limited the applications to those where periodic quenching could be applied. Numerous implementations of SRF based on Q-enhanced inductors were considered, but they lacked the stability and controllability necessary for implementing into a commercial chip application.

A variable filter design is described in U.S. Pat. No. 10,050,604 (Nielsen et al.) entitled "Variable Filter", incorporated herein by reference. The variable filters described by Nielsen et al. include single and multiple resonator feedback circuits. Multiple resonator feedback circuits ("MRF") may be used to provide a higher Q-enhancement than a single resonator feedback ("SRF") circuit.

SUMMARY

According to an aspect, there is provided an active feedback bandpass filter that allows for stable stability high Q enhancement that may be established in a cost effective, integratable form and that may be suitable for use, for example, in wireless communication devices.

In some aspects, the multi-resonator feedback (MRF) variable filter may be used to realize a tunable filter of arbitrary filter order with very high selectivity while maintaining a high degree of stability and orthogonal control. The orthogonal control may allow the calibration of the MRF based filter to be simplified.

In some aspects, the variable filter may be the tunable bandpass filter implemented with adjustable lumped inductor and capacitor resonance circuits. The term "resonator" may involve transmission line components or mechanical vibration devices that may be adjustable, or other tunable resonators. Adjustments to the variable filter that decrease the bandwidth or increase the quality factor Q of the resonator, may lead to instability resulting directly from the resonant structure or changes to the circuit environment such as temperature and supplied voltages or aging of components. Such instability may be avoided by modifying the filter circuit structure by using multiple resonators in a feedback loop and building in a soft saturation characteristic. This may further simplify the calibration of the variable filter.

According to an aspect, there is provided an AFBF as a tunable high Q filter segment that may be based on an MRF that incorporates an active gain or scaling block (ASB) in a loop. A plurality of AFBF filters may be included in a multipole tunable filter which may be of practical utility in a variety of applications. The stability and orthogonal control may be understood in the context of a Nyquist curve of the MRF and the device line of the active scaling block intersecting at near right angles.

According to an aspect, there is provided a method of stabilizing a variable RF filter for an analog electromagnetic signal against circuit oscillation. The method allows the stability of the variable RF filter to be maintained within predetermined operating conditions by controlling the variable frequency or variable resonator(s) and the variable phase shift to achieve a Nyquist contour that satisfies one or more desired conditions that are indicative of stability, as described and/or claimed below.

According to an aspect, there is provided a method of stabilizing a variable filter for an analog electromagnetic signal against circuit oscillation, the method comprising the steps of: providing a signal loop comprising a signal input, a signal output, and a plurality of variable circuit elements connected in the signal loop, the plurality of variable circuit elements comprising an adjustable resonator and an adjustable gain block, the signal loop having a variable frequency response that is characterized by a central frequency, a frequency passband, a response Q, and an operating point and a resonator response curve that are plottable in a Cartesian s-plane having an origin, a real axis, and an imaginary axis; and maintaining stability of the variable filter within an operating range by controlling the adjustable resonator and the adjustable gain block such that, in the Cartesian s-plane, the resonator response curve satisfies an orthogonality stability condition. The orthogonality stability condition may comprise a constant radius circle that encompasses the resonator response curve, that is centered on the origin, and that passes through the operating point; the resonator curve being orthogonal or nearly orthogonal to the real axis where the resonator response curve crosses the real axis; and/or the frequency control being orthogonal or nearly orthogonal to the response Q control.

According to an aspect, there is provided a method of controlling the closed loop phase shift of an active regenerative feedback circuit, such as by providing the MRF with a discrete phase shifter of four states, separated by 90 degrees. The resonators of the MRF may be tuned to the same frequency to act as a stable bandpass filter. Even greater stability may be achieved if the resonators of the MRF are individually tuned. This enhanced stability may be achieved by appropriately arranging the poles of the individual resonators, such as to make the real axis crossing of the complex plane Nyquist contours perpendicular to the real axis. This may provide for decoupled and independent control of the bandpass center frequency and loop gain.

According to other aspects, the SRF and MRF may be calibrated given a plurality of AFBF components connected in series, where a feedback path is connected from the output of the last AFBF to the input of the first AFBF, each AFBF output is connected through a switch to the counter and detector, wherein the self-oscillation AFBF is calibrated with a counter and then uses as a calibrated sinusoidal excitation source to calibrate another AFBF in terms of throughput response of the MRF or SRF associated with the said AFBF; the phase of the throughput response of the AFBF may be inferred from the measured amplitude response by the detector based on a calculation; the AFBF of level 1 may be implemented as Q spoiling to set poles of the resonator curve such that a near constant radius response in the vicinity of the point of intersection with the device line is achieved.

In other aspects, the features described above may be combined together in any reasonable combination as will be recognized by those skilled in the art.

BRIEF DESCRIPTION OF THE DRAWINGS

These and other features will become more apparent from the following description in which reference is made to the appended drawings, the drawings are for the purpose of illustration only and are not intended to be in any way limiting, wherein:

FIG. 1a is a schematic diagram of a resonator module with a single resonator element and control inputs that drive pole positions in the s-plane.

FIG. 1b is an s-plane graph showing the pole positions of the resonator module of FIG. 1a.

FIG. 2 is a schematic diagram of a variable filter showing unidirectional signal flow.

FIG. 22b is an expanded view of the plot of FIG. 22a.

DETAILED DESCRIPTION OF PREFERRED EMBODIMENTS

Figure 3:
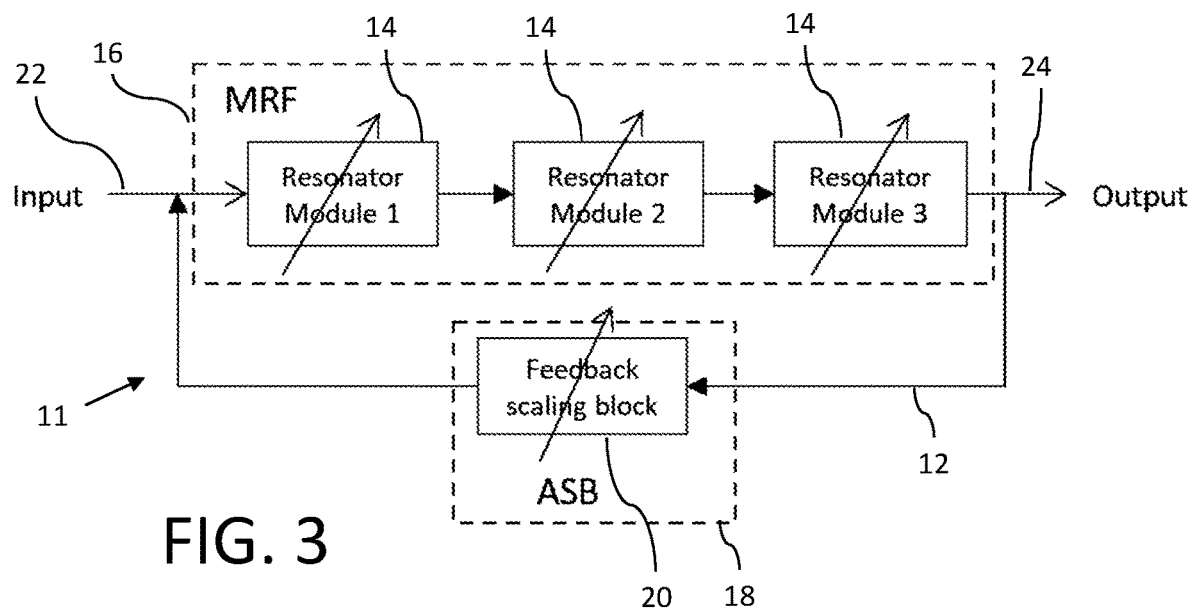
FIG. 3 is a schematic diagram of an MRF block implementation of an AFBF circuit.
Figure 4:
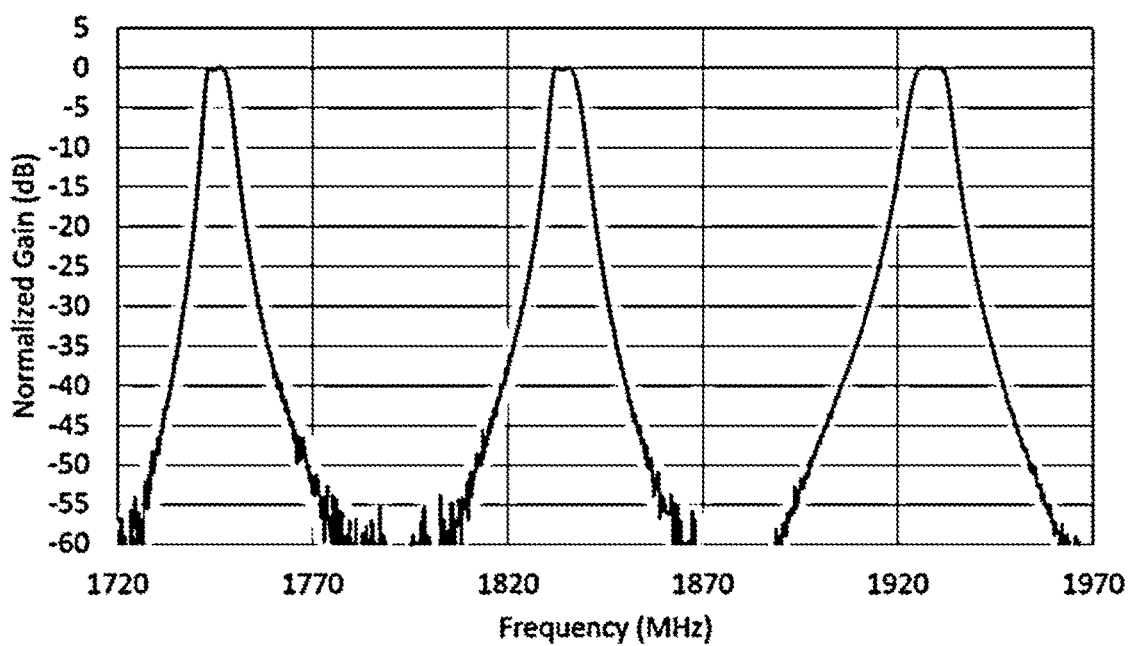
FIG. 4 is a bandpass response of a third order Chebyshev filter implementation with a cascade of three Q-enhanced pole filters.

A filter circuit, generally identified by reference numeral 10, will now be described with reference to FIG. 1a through 33.

Filter circuit 10 described herein may be designed to be used with analog signals, such as RF (radio frequency), millimeter wave, and higher or lower electromagnetic frequency filtering applications. Filter circuit 10 is designed and controlled to remain stable, which generally also results in orthogonal control of frequency and bandwidth of filter circuit 10. This may be achieved through appropriate control of the frequency, gain, and phase of a signal loop 12.

Passive highly selective bandpass filters are not practically realizable on direct chip integration because resonator components such as lumped inductors and capacitors have limited Q. An active feedback that recirculates the resonant signal into the resonator with gain in the signal loop may be used to increase Q, where AFBF circuit 11 includes a signal loop 12 that includes a signal path and feedback path. Within this disclosure a unidirectional flow will be considered. However, a bidirectional signal flow may also possible if AFBF circuit 11 achieved feedback gain based on, for instance, negative resistance. Hence while the descriptions herein are based on unidirectional flow, a bidirectional signal flow may also be used.

Single Resonator Tunable Filter Layout

The active multi-resonator feedback bandpass filter (MRFB) is made up of combinations of one or more of the resonator modules 14 depicted in FIG. 1a. The response of resonator module 14 in the s-plane is represented by the pole-pair on the right, but in the rest of this document, only the one pole in the upper half of the s-plane will be referred to.

Resonator module 14 includes a resonator element and an optional scaling block (not shown) in feedback across the resonator element to allow for both feedback and Q-control. The optional scaling block, if used, may have positive or negative gain and may be referred to as a Level 1 scaling block. This will be discussed later in more detail related to stability. Alternatively, the Q-control may be provided by connecting resonator module 14 within a feedback path 12 having a scaling block 20 as shown in FIG. 2.

While the concepts described herein regarding the generalized active feedback bandpass filter (AFBF) circuit 11 implementation pertain to both bidirectional and unidirectional signal flow, will only examples of the unidirectional version will be presented. While the unidirectional circuit implementations are easier to implement, this does not imply that the principles presented herein are limited to applications of unidirectional signal flow. The unidirectional signal flow circuit architecture with single resonator feedback (SRF) of AFBF circuit 11 is shown in FIG. 2.

With respect to the circuit stability of ABFB circuit 11, as the Q enhancement becomes more aggressive, the feedback is controlled to place the closed loop resonant pole ever closer to the s-plane $j\omega$ axis as depicted in FIG. 1b. This requires calibrated control that may need to account for minute changes in the loop components due to factors such as temperature. One method is that of deliberately placing the pole on the right of the $j\omega$ axis such that the Q enhancement is unstable, and then periodically quenching the circuit. While providing controllable narrowband gain, the periodic quenching operation is disruptive to the signal processing function that filter circuit 10 is intended for. This method also reduces the precision with which poles may be placed and therefore the accuracy of the filter response.

Multiple Resonator Tunable Filter Layout

Referring to FIG. 3, the feedback architecture for depicted AFBF circuit 11 is based on the multi-resonator feedback (MRF) and includes an MRF block 16 with a plurality of resonator modules 14 and an ASB block 18 with a feedback scaling block 20 between a signal input 22 and a signal output 24 Each resonator module 14 may or may not include a Level 1 feedback loop, as discussed above. ASB block 18 is specified as active as the gain scaling may be greater than unity. Advantages to this MRF may be as follows:

Each of resonator modules 14 has a unique pole, but with feedback scaling block 20 across resonator modules 14 as shown, the MRF block 16 behaves as a single dominant pole bandpass filter. That is, one pole moves either away from or toward the $j\omega$ axis but is close to the $j\omega$ axis, while the adjacent poles move in the opposite direction but are further into the left half s-plane.

The feedback loop is inherently more stable than using a single resonator for reasons that will be explained.

The control of the closed loop poles becomes simpler and more robust as the Q enhancement and center frequency control become orthogonal in the s-plane, and hence independent, as will be explained.

The multiple poles result in higher skirt steepness that what is achievable with a single Q-enhanced resonator.

These attributes may be used to achieve a well behaved and stable Q-enhanced filter that is easily controllable, has provision for self-calibration, and may be Q-enhanced, for example, with an MRF Q in excess of 1000.

A prototype of an MRF using three resonators with feedback, illustrated in FIG. 3, was implemented with surface mount components with a tunable range of 1700 to 1950 MHz. Three of these prototype MRF filters were then cascaded to implement the third order Chebyshev tunable bandpass filter response shown in FIG. 4, where the center frequency was successively adjusted to 1745, 1825, and 1930 MHz. Each of the dominant pole MRFs realized a pole of the multipole Chebyshev filter, with the Q of the individual MRFs in excess of 1000. The overall filter was observed to be stable, and the tuning/calibration algorithm was simple and robust.

As used herein, a reference to a single resonator implies a resonator with a single dominant pole, and a reference to multiple resonators implies one or more resonators that provide multiple dominant poles. Typically, this will be accomplished with multiple resonators that may be individually controllable as discussed below, however multiple dominant poles may be provided by a single, multi-pole resonator.

Selective and Stability of the Idealized Active Feedback Bandpass Filter (AFBF)

As noted, the AFBF circuit 11, incorporates a feedback loop with active components. Two types of instability that may effect such a feedback loop include the following:

Type I Instability: The first type of instability arises when the closed loop poles are inside of the Nyquist encirclement. This may be used as a constraint for AFBF circuit 11 calibration described herein. Part of the calibration may be to determine the boundaries of the Nyquist encirclement and then to ensure that the closed loop poles are on the outside of the encirclement. Note that the Nyquist stability criteria is limited to the encirclement as the open loop response is assumed to be stable. If it is not, then the Nyquist stability criteria becomes more tedious to apply.

Type II Instability: The second type of instability is more subtle and recognizes that operating AFBF circuit 11 outside of the encirclement may not be sufficient to ensure stability if there are nonlinear effects within the circuit. An example of a nonlinearity is that, as the signal amplitude grows then there may be a small negative phase shift due to an incremental increase in loop delay. This is described below. If this phase change creates an increase in the Q enhancement by moving the operating point closer to the Nyquist stability contour (i.e. the resonator contour), then the signal grows larger. This causes an increase in phase shift, which in turn moves the operating point ever closer to the Nyquist contour. If the operating point crosses the Nyquist contour, then the circuit becomes unstable.

Active Feedback Bandpass Filter (AFBF) Tunable Filter Loop

Figure 5:
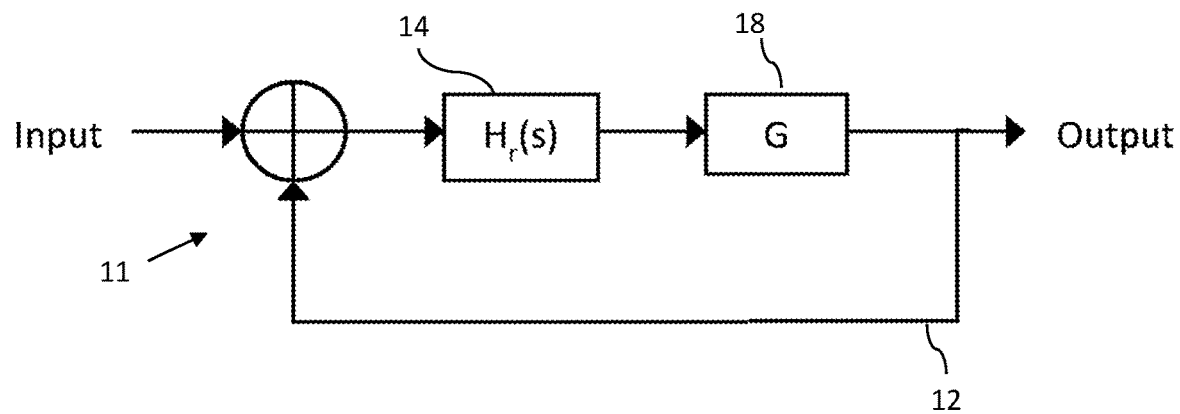
FIG. 5 is a schematic diagram of an AFBF circuit split into two cascaded transfer functions.

To understand the equivalent filter poles, and thereby the filter selectivity and stability, FIG. 5 shows signal loop 12 of AFBF circuit 11 from the perspective of the feedback loop. Only signal loop 12 is relevant in this consideration and hence the details of signal input 22 and signal output 24 may be omitted.

The loop consists of two transfer functions with $H_r(s)$ representing the resonators of the MRF block 16 and G representing the active settable gain block providing a gain of G which is ASB block 18. Note that the filter selectivity is invariant of the placement of the signal input 22 and signal output 24.

In the analysis below, the following simplifications are made:

a) A factorization is done such that all of the frequency dependent and linear components of the feedback loop are grouped into $H_r(s)$: the possibility that $H_r(s)$ has some nonlinearity will not be considered;

b) G is assumed to be frequency independent for simplicity and the frequency independent components are grouped into G. In reality, G may have some second order frequency dependence and $H_r(s)$ will not be entirely linear. While this may complicate the analysis, the principles discussed herein remain the same.

c) $H_r(s)$ and G are considered to be time invariant. This is an approximation as the control of these components is dynamic. However, it will be assumed that the control is much slower than the time constant associated with $H_r(s)$. A stricter constraint is that the control has be slower than the time constant associated with the closed loop response of AFBF circuit 11 which with high levels of Q enhancement may be an issue resulting in the analysis given being approximate. Again, the limitations of the analysis herein do not affect the principles discussed herein.

Figure 6:
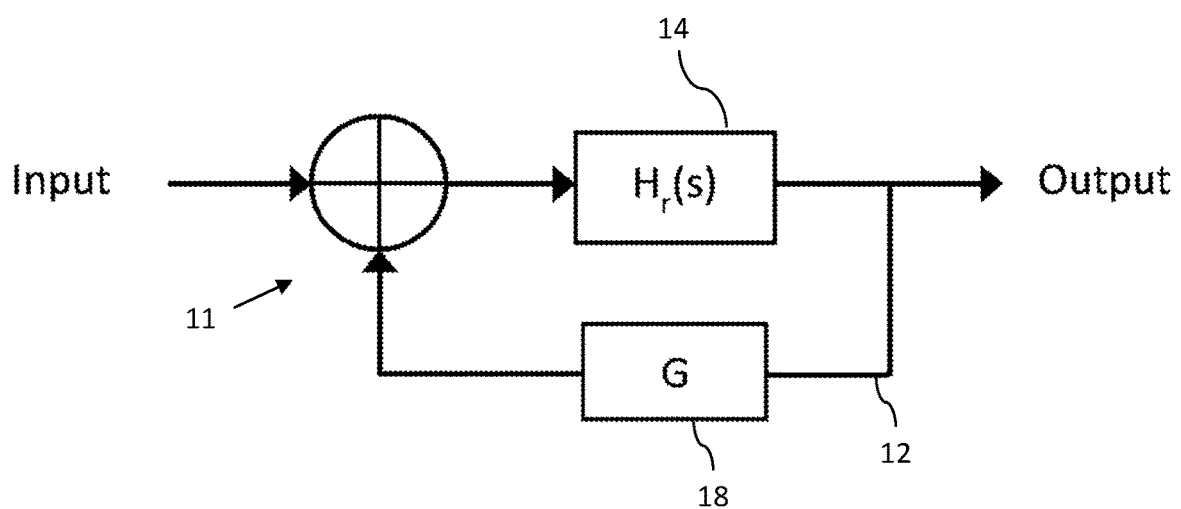
FIG. 6 is an alternate circuit block diagram to the AFBF circuit in FIG. 5.

Summarizing, $H_r(s)$ and G of the loop shown in FIG. 5 represent behavioral abstractions rather than physical circuit blocks in the specific order shown. Later when specific nonlinear behavior is introduced, further specifics of the circuit will be considered, at which point the order of the circuit blocks becomes important, as do the input and output ports. The closed loop transfer function from the input to the output shown in FIG. 5 is given as $$H_{cl}(s) = \frac{H_r(s)}{\left(\frac{1}{G} - H_r(s)\right)}$$

where the Nyquist stability contour is $$\frac{1}{G} = H_r(j\omega)$$

which represents the boundary between the stable and unstable regions in the s-plane. Consider now an alternate arrangement of the components in AFBF circuit 11 as shown in FIG. 6. The closed loop transfer function of the circuit shown in FIG. 6, from the input to the output is:

$$H_{cl}(s) = \frac{H_r(s)}{(1 - GH_r(s))}$$

Note that the Nyquist stability contour for both circuits FIG. 5 and FIG. 6 is $$\frac{1}{G} = H_r(j\omega)$$

This means that for both circuits, the Nyquist stability analysis is the same.

The following assumptions may be applicable:

a) $H_r(s)$ and G are in themselves stable transfer functions and hence the region in the s-plane that is encircled by the Nyquist contour is unstable regardless of the number of clockwise encirclements. Furthermore, $H_r(s)$ and G are assumed not to have any marginally stable poles on the jw axis and hence Nyquist excursions around such poles is not an issue.

b) $H_r(s)$ and G are causal: the encirclement will be in the clockwise direction.

c) While $H_r(s)$ is normally complex valued, G is assumed to be a positive real value implying that $H_r(s)$ contains all phase shifts associated with the loop.

Detailed Analysis of Ideal Single Resonator AFBF

Start with the idealized amplitude normalized response of a single resonator shown in FIG. 5 with a transfer function of $$H_r(j\omega) = \frac{2D_r\omega_r s}{s^2 + 2D_r\omega_r s + \omega_r^2}$$

where $D_r = 1/(2G)$.

Figure 7:
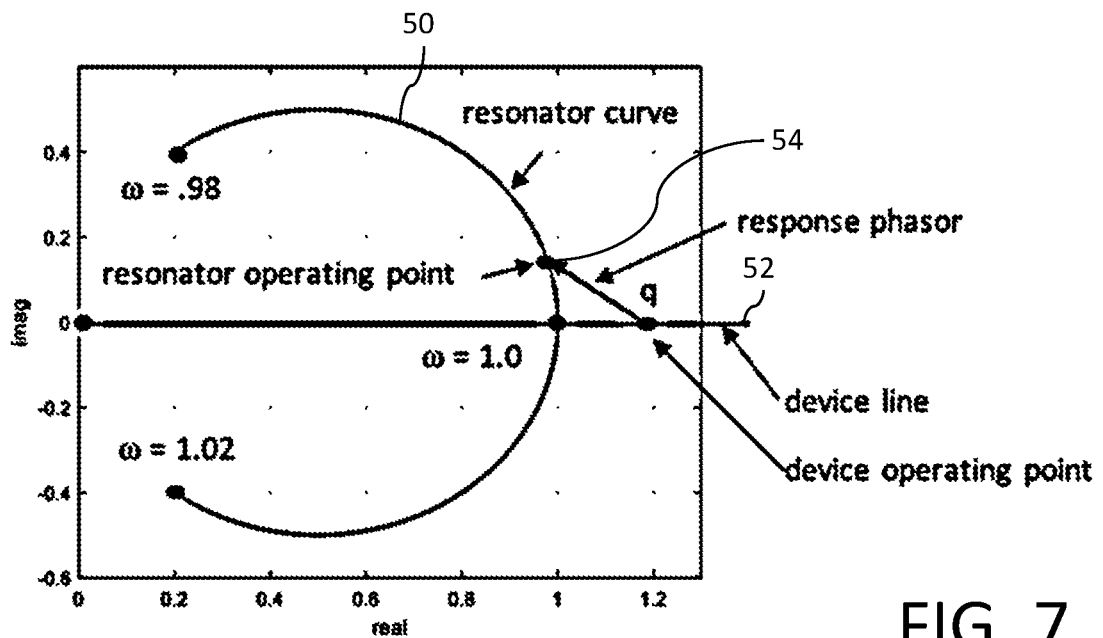
FIG. 7 is a resonator curve and device line for a single amplitude normalized resonator.
Figure 8:
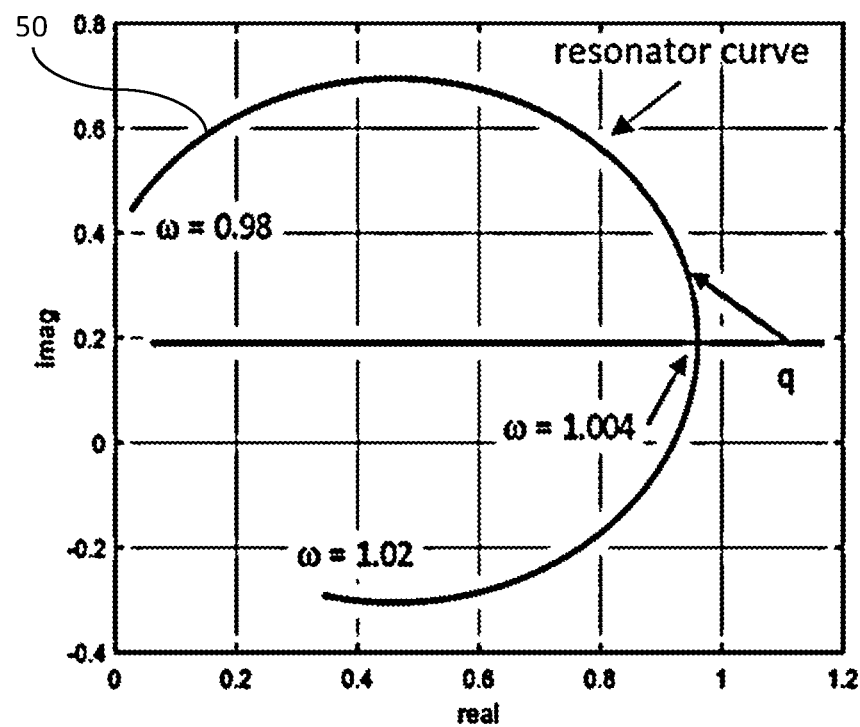
FIG. 8 is a resonator curve showing frequency warp resulting from a phase shift.

By ideal it is implied that there are no parasitic elements in the loop resulting in additional poles or zeros than those of $H_r(s)$. This results in a circular Nyquist trajectory of diameter 1 and centered at (½,0). For this illustration, a normalized $\omega_r=1$ and $D_r=0.01$ is assumed, resulting in the response as shown in FIG. 7. For convenience q may be defined as follows:

$$q = \frac{1}{G} \in \text{real}$$

The diagram of FIG. 7 assists in understanding the resonance of AFBF circuit 11. In this case, the Nyquist curve of the resonator, identified as line 50, is for a single second order resonator. The Nyquist curve is plotted over a range of frequency from $\omega=0.98$ to $\omega=1.02$ where the point of $\omega=1$ is the point of interception on the real axis. The Nyquist curve is therefore a mapping of the resonator transfer function for a set of frequencies as plotted in the complex plane. The device line 52 is the line of permissible values of G.

As stated earlier, G is taken to be real valued with zero phase. That is any phase shift associated with scaling block 20 of the AFBF circuit 11 is assumed to be part of the resonator 14 and hence will be included in the Nyquist curve. This partition allows the Nyquist curve to be used as a simple analysis tool of stability.

Now G has a specific value, and q=1/G is plotted as an operating point. As long as the operating point q is outside of the encirclement of Nyquist curve 50 then AFBF circuit 11 is stable. However, if operating point q moves to the inside of the encirclement then AFBF circuit 11 becomes unstable. If operating point q is moved to the intercept point of the Nyquist curve and the device line, then AFBF circuit becomes marginally stable. Operation here results in a steady state oscillation at the frequency of the Nyquist curve at that point.

Next consider the response phasor. Note that the closed loop response is given as $$H_{cl}(s) = \frac{\frac{1}{G}H_r(s)}{q - H_r(s)}$$

based on the definitions given. The Nyquist curve is $H_r(j\omega)$ such that for the Nyquist stability the mapping of $\omega$ is of significance such that the following is considered $$H_{cl}(j\omega) = \frac{\frac{1}{G}H_r(j\omega)}{q - H_r(j\omega)}$$

The denominator goes to zero at the marginally stable point where the operating point q is coincident with the Nyquist curve of $H_r(j\omega)$. Next consider the response phasor which is $H_r(j\omega)-q$ as shown in the diagram. The magnitude of the denominator of $H_{cl}(j\omega)$ is therefore the length of the response phasor. Now the numerator of $H_r(j\omega)/G$ is wideband relative to the fast frequency variation of the response phasor. Hence the magnitude of the closed loop transfer function can be approximated as being proportional to the inverse of the magnitude of the response phasor. Hence as the operating point q moves closer to the Nyquist curve then the gain of $H_{cl}(j\omega)$ increases significantly for frequencies approaching the frequency corresponding to the intercept point of the Nyquist curve. Also, the bandwidth decreases as q is moved toward the Nyquist frequency Finally, the rotation of the response phasor with frequency is significant as this is also approximately the phase of $H_{cl}(j\omega)$ for frequencies within the close loop passband.

Additional definitions to be made relative to FIG. 7: The Nyquist curve is denoted as the resonator curve 50, and the point on the resonator curve at the specific frequency of interest is the resonator operating point 54.

With these definitions return to the single resonator AFBF circuit 11 of FIG. 7. A key observation is that the shape of resonator curve 50 is invariant to both $\omega_r$ and $D_r$. Rather, the frequency mapping of resonator curve 50 just warps with changes to $\omega_r$ and $D_r$. The smaller $D_r$ is—the higher the gain G—the faster resonator operating point 54 changes with frequency. Also, as $\omega_f$ is increased, then the frequency warping slides along resonator curve 50 in the counterclockwise direction.

Based on this property, the control of AFBF circuit 11 is seen to be orthogonal for a circular Nyquist resonator curve 50:

Tuning the varactors in the resonator 14, the frequency mapping can be warped along resonator curve 50 which shifts the bandpass response.

Likewise, with a shift in loop gain, the device operating point may be shifted along the device line as the diameter of the Nyquist circle increases.

Note that it is the orthogonal intersection of the resonator and device curves that gives uncoupled orthogonal control. With non-ideal components there is a minor coupling of the controls from additional poles and zeros that affect phase and gain with frequency, but these are secondary. For example, the resonator insertion loss may be dependent on the tuning frequency and hence may simultaneously warp the frequency mapping and device operating point 54. Another example is that gain block 20 has some phase shift associated with the change in gain, which moves device operating point 54 and causes a shift in the resonator frequency warping. These examples are addressed below. Also, again note that the resonator and device are related to function groupings and not physical circuit components.

In addition to orthogonal control of the frequency and the Q enhancement, the frequency warping property will be shown to be important in the context of the stability issues to be detailed later. An example of frequency warping is presented in FIG. 8. Here the resonance frequency is shifted by 0.4 percent, resulting in a warping of the frequency along resonator curve 50. However, note that the control of Q enhancement and the frequency are still orthogonal as the Nyquist curve remains orthogonal to the real axis. This is due to the invariance of the shape of the resonator curve to $\omega_r$ and $D_r$.

This may be recognized as the ideal case for Q enhancing the filter, as device line 52 and Nyquist curve 50 meet at right angles for the following reasons:

This implies that control of frequency and Q-enhancement is not coupled, resulting in a desirable control simplification as well as simpler and more robust adaptive algorithms for operating the filter.

Secondly, the control loop is stable for any level of Q enhancement.

Thirdly, the overall frequency response of AFBF circuit 11 in is monomodal with the mode center at the desired Q enhanced frequency and has a symmetrical frequency response.

Non-Ideal Single Resonator Feedback Circuit: Propagation Delay Phase Shifts

Next, a change in the feedback circuit due to a finite propagation delay around the feedback loop is considered. This results in a frequency dependent phase shift of resonator curve 50 that will mainly pivot resonator curve 50 around the origin by a clockwise rotation proportional to the resonance frequency. Secondly, a small distortion of the shape of resonator curve 50 occurs which increases as the frequency deviates from resonance.

Figure 9:
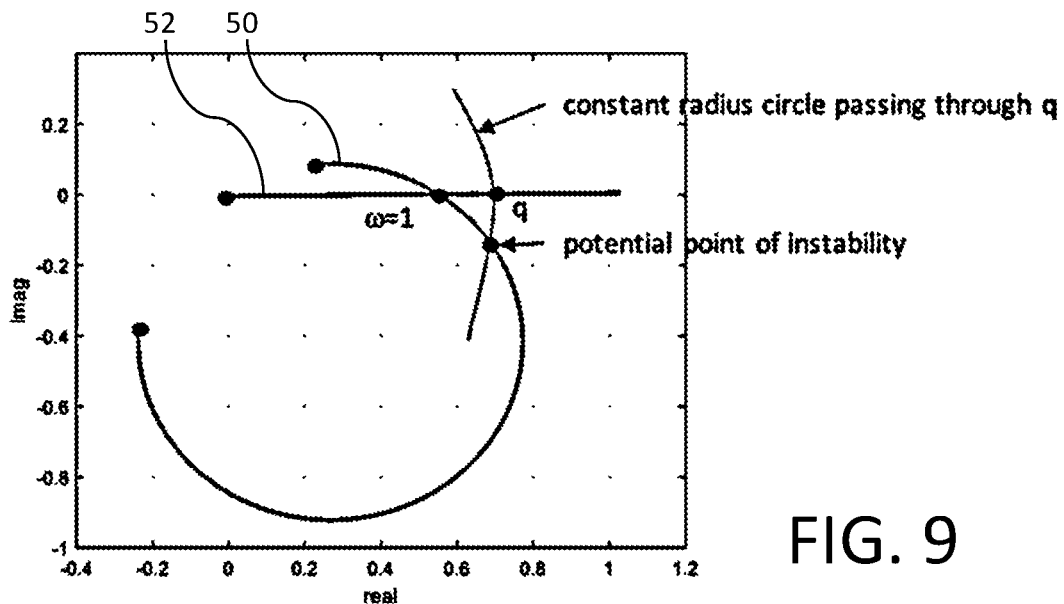
FIG. 9 is a resonator curve showing the result of resonator curve rotation, distortion and frequency warping, all showing that the key the resonator curve intersection is not orthogonal to the device line.

This can be corrected for by changing the resonance frequency of the resonator which results in the frequency mapping being warped along resonator curve 50. Regardless of the rotation, distortion and frequency warping, the result is typically that device line 52 and resonator curve 50 will not intersect at right angles, as shown in FIG. 9.

Figure 10:
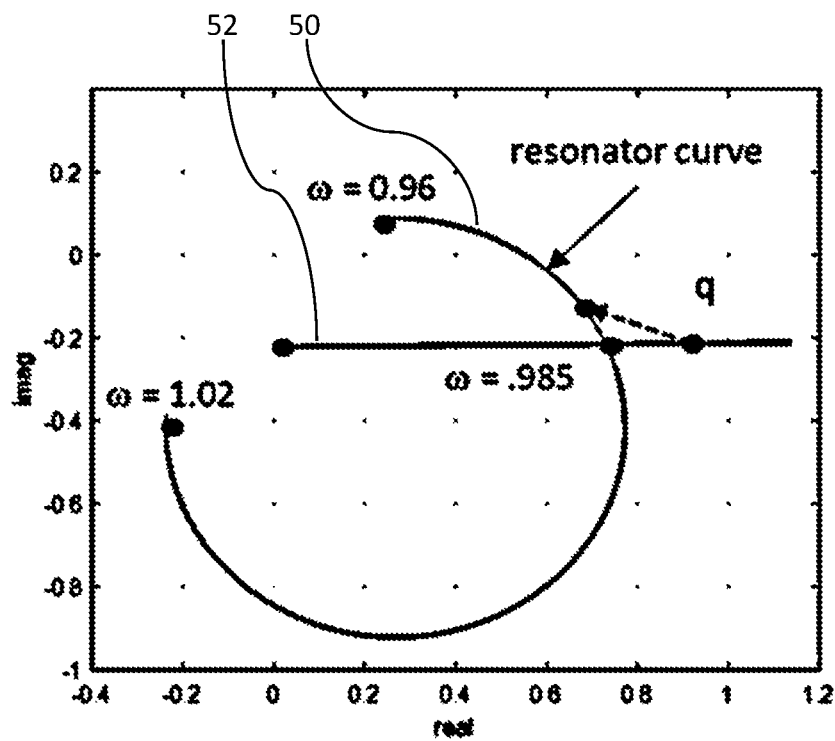
FIG. 10 is a resonator curve modified based on a phase shift of one radian ($T_d=1$).

The effect of a constant phase shift that occurs within the feedback loop which is denoted as θ may be quantified. The loop phase shift is accounted for by rotating the resonator curve by θ. In practical implementations one would not get a constant phase shift but generally a phase shift that progressively increases with frequency due to a signal transport delay. Clearly there will be some amount of delay in a unidirectional AFBF circuit 11 which will result in such a phase rotation. The phase shift may also have a frequency dependent component associated with it which can be modelled as a pure transport delay. As such the single resonator transfer function is represented as:

$$H_r(j\omega) = \frac{2D_r\omega_r s}{s^2 + 2D_r\omega_r s + \omega_r^2} e^{-iT_d s}$$

where $T_d$ is the normalized delay. An example response is shown in FIG. 10, where a delay of $T_d=1$ is applied to the feedback loop (implying one radian of phase shift at the resonance of $\omega=1$). Due to this phase shift, the bandpass center frequency is now shifted to $\omega=0.985$.

This delay resulting in an excess loop phase shift has two effects:

a) The bandpass center frequency (BCF) has shifted;
b) Resonator curve 50 is no longer orthogonal to the device line at the point of intersection.

Figure 11:
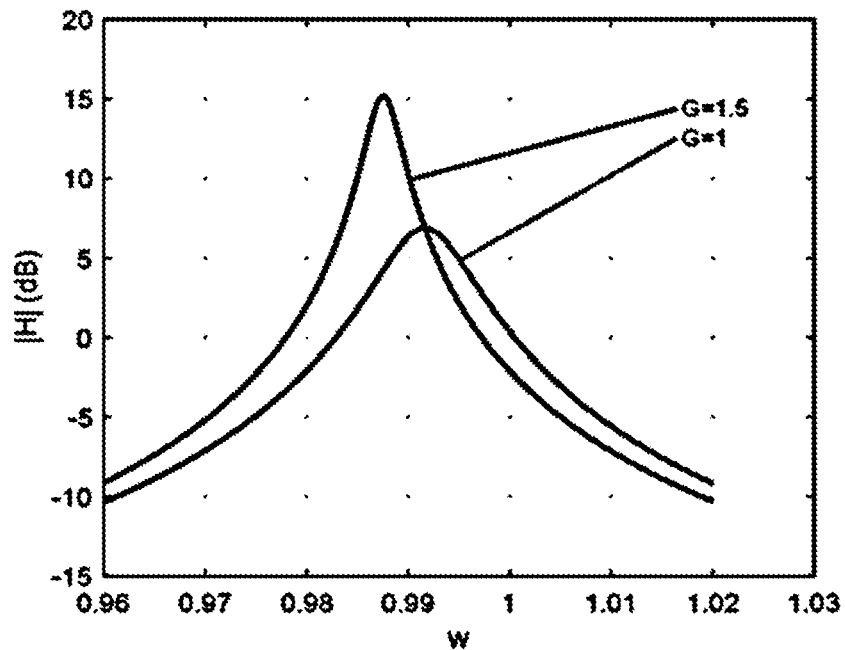
FIG. 11 is a frequency response plot showing how Q enhancement with increasing G results in a shift of the closed loop resonance frequency of a single resonator AFBF circuit.

The non-symmetrical resonator curve 50 about device curve 52 results in a coupling of the frequency and Q enhancement control. This is illustrated in FIG. 11 where G is increased from G=1 to G=1.5. This coupling of Q enhancement and frequency results in added complications for the control algorithm. As will be described later, this non-orthogonal intersection of device line 52 and resonator curve 50 also sets up AFBF circuit 11 for potential instability.

Figure 12:
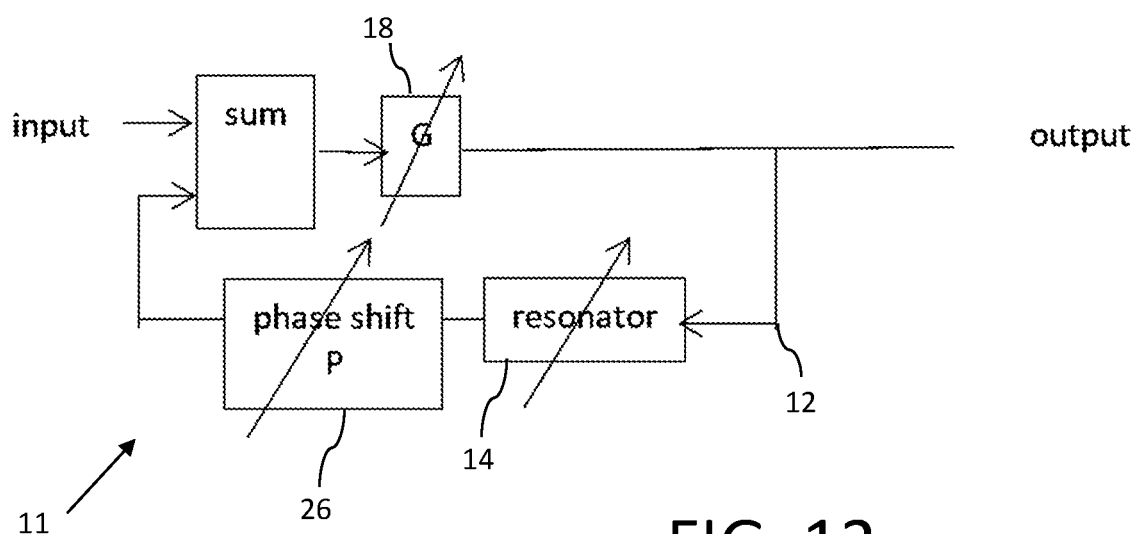
FIG. 12 is a schematic diagram of a single resonator AFBF with an added phase shifter.

These single resonator problems may be avoided by adding a programmable phase shift 26 of P to the feedback loop as shown in FIG. 12. The phase shift required is such that the total phase shift around loop 12 at the bandpass center frequency is a multiple of $2\pi$ radians.

Figure 13:
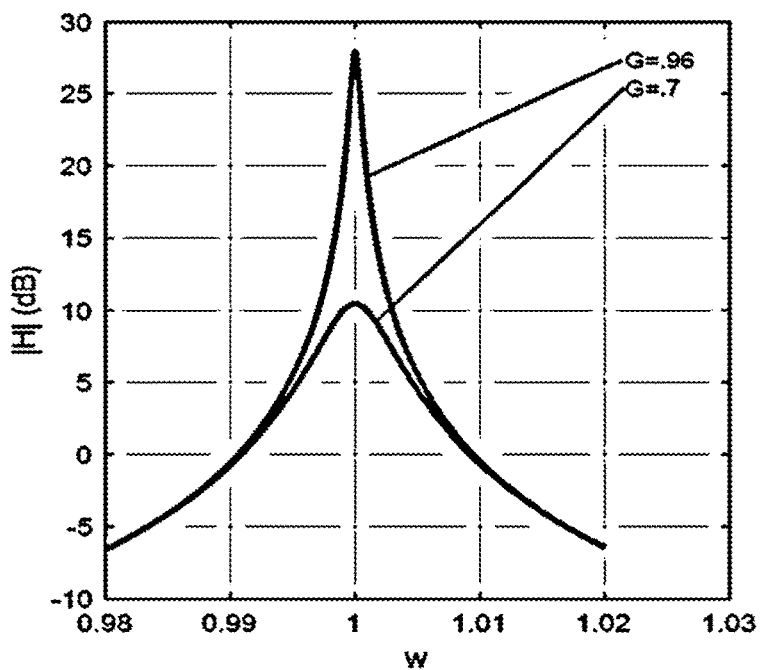
FIG. 13 is a is a frequency response plot showing how compensation of phase shift with a phase shifter results in realignment and proper Q enhancement.

With P adjusted correctly, the frequency control is again orthogonal to the Q enhancement as shown in FIG. 13. This realignment approximately restores the orthogonality of resonator curve 50 and device line 52 at the point of interception. An implementation issue with the phase shifter of P is that it may be difficult to realize a constant phase shift with change in frequency. Typically, the phase shift is more equivalent to a delay. Hence, a practical implementation of P may be regarded as simply adding more loop delay such that at resonance, the phase shift around the loop corresponds to an integer number of wavelengths.

Joint Optimization of Single Resonator Phase Shift and Resonance Frequency $\omega$ The algorithm for jointly optimizing the single resonator values of the phase shift control P and the resonance $\omega_r$ are as follows:
a) Starting with $\omega_r$ and P at some value, move the operating point until self-oscillation starts which will be the bandpass center frequency.
b) Change $\omega_r$ until the desired bandpass center frequency is obtained.
c) Then vary P in the direction that reduces G required for self-oscillation.
d) Then correct $\omega_r$ for the desired bandpass center frequency.
e) Repeat the last two steps until convergence is reached with the desired bandpass center frequency of $\omega_0$ and minimum G for self-oscillation at $\omega_0$ is obtained.

Graphically, this is equivalent to the orthogonality of resonance curve 50 and device curve 50 being restored in the neighborhood of the intercept point which has to correspond to coo of the resonance curve.

Sources of Instability on a Tunable Single Resonator Filter

Instability Caused by Loop Phase Shift

Figure 14:
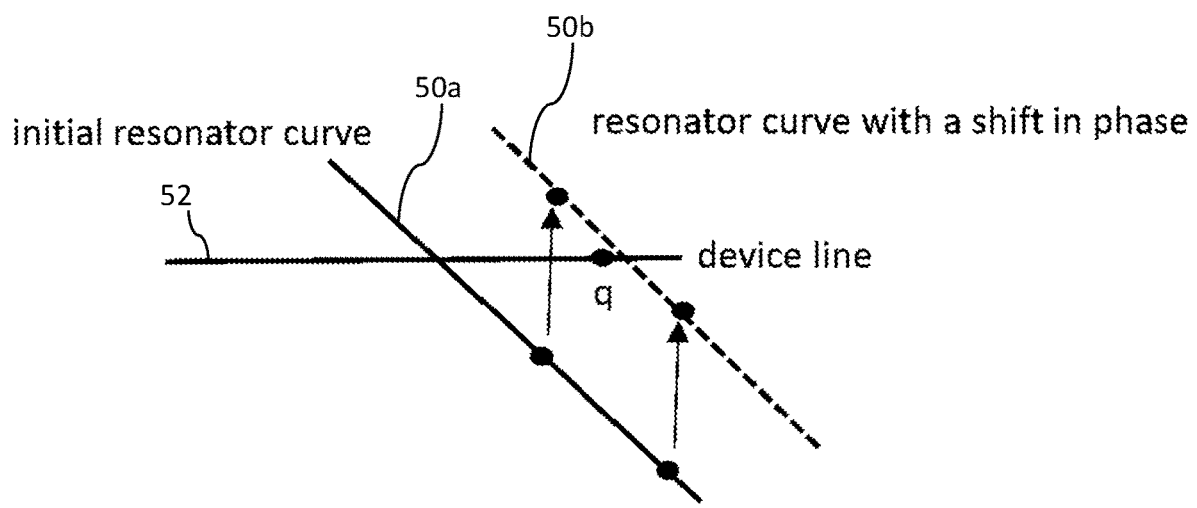
FIG. 14 is illustration of a resonator curve showing instability brought on by a circuit phase shift.

There is an additional consequence of not accurately providing the phase shift of P which results in an issue of potential stability when the Q enhancement is increased. This is illustrated in FIG. 14. Shown is device line 52 with an operating point q and the initial resonator curve 50a. The filter is stable as q is outside of the encirclement of initial resonator curve 50a.

Now suppose that there is a small phase shift that occurs within the feedback loop for various reasons, such that initial resonator curve 50a shifts up in position to the shifted resonator curve 50b. Now q is inside the Nyquist encirclement and instability sets in. This will cause a frequency component to grow exponentially which will result in q reduction, shifting to the right due to a gain compression. The end result is that the filter will self-oscillate at this frequency. To stop the oscillation, it is necessary to decrease G such that q moves further to the right outside of the encirclement. Depending on the second order dynamics, there could be hysteresis associated with this instability such that q has to be pulled a significant distance from the resonator curve. Such a hysteresis makes calibration and usage for higher Q enhancement impossible.

This is the basic explanation for the Type II instability. Suppose that resonator 14 contains a varactor diode that increases in average capacitance for a larger signal swing. Assume that q is close enough to resonator curve 50 such that this increase in capacitance is sufficient to cause resonator curve 50 to shift in the direction shown in FIG. 14. Then with this shift the Q enhancement becomes larger, increases the signal further and then shifts resonator curve 50 more. Eventually resonator curve 50 crosses the q point which now within the enclosed region of the resonance curve and AFBF circuit 11 begins to self-oscillate.

Figure 15A:
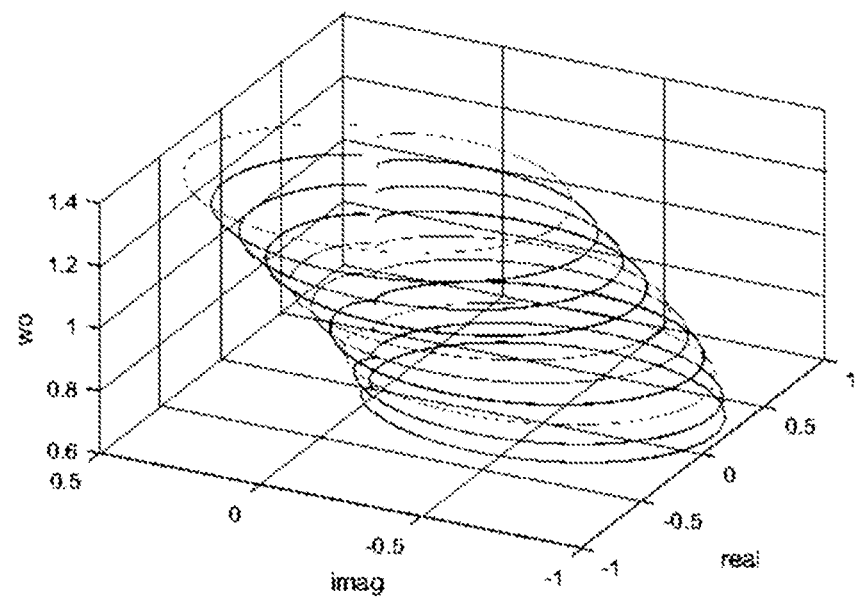
FIG. 15a is a three-dimensional plot of the shift in a Nyquist contour plot with a change in $w_o$.
Figure 15B:
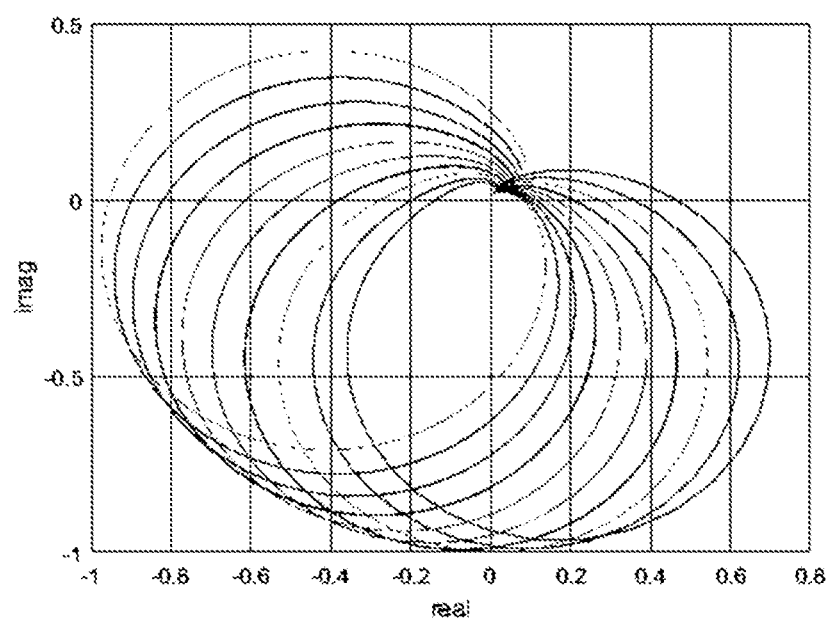
FIG. 15b is a two-dimensional plot of the shift in a Nyquist contour plot with a change in $w_o$.

Source of Instability in Single Resonator Tunable Filter AFBF Due to Center Frequency Tuning It is useful to visualize the variation in resonator curve 50 with an SRF and a delay as a function of the resonator tuning frequency. The Nyquist contour will generally change shape as a function of tuning voltage, meaning that the resonator response is no longer shape invariant, as shown in FIG. 15a and FIG. 15b. Within this document, the Nyquist contour is defined by the transfer function of the open loop response of the variable filter in the complex frequency plane or s-plane. As resonator curve 50 changes shape with the frequency control parameter, there will be a susceptibility of a Type II instability.

Note that as $w_o$ is increased that resonance curve 50 rotates in a CCW direction. Consider q on the real axis and $w_o$ being increased without backing off the loop gain. This will result in q moving inside the enclosure of the resonance curve and AFBF circuit 11 will oscillate. For high Q enhancement, small changes in the resonator $w_o$—whether inadvertently controlled or induced by a growing signal level—can therefore result in instability.

Figure 16:
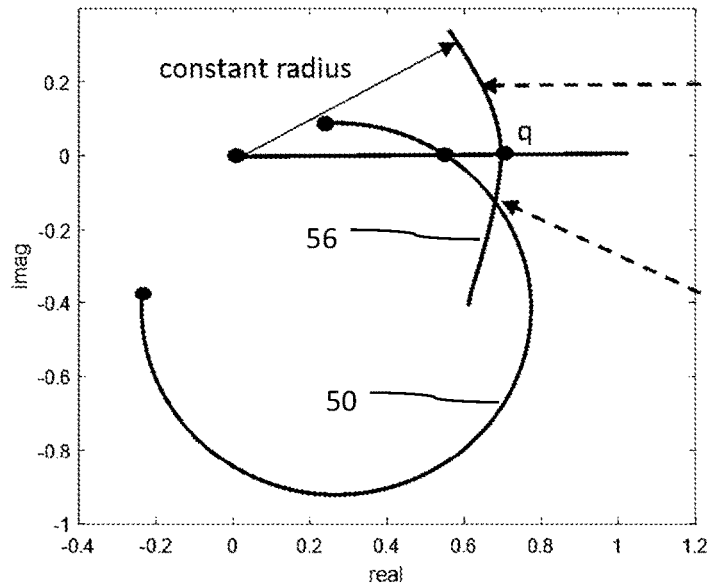
FIG. 16 is a single resonator operating contour that crosses the Nyquist stability contour as a result of an increase in Q.

Source of Instability in Single Resonator Tunable Filter AFBF Due to Q-Enhancement FIG. 16 is another illustration of a Type II instability intended to illustrate the limitation of Q enhancement. In the s-plane, a constant radius circle 56 around the origin is drawn that goes through the stable operating point q. Where this circle 56 intersects resonator curve 50 there is a strong potential for instability. This simplified graphic does not account for the small change in the resonator curve as the frequency shift occurs.

Figure 17:
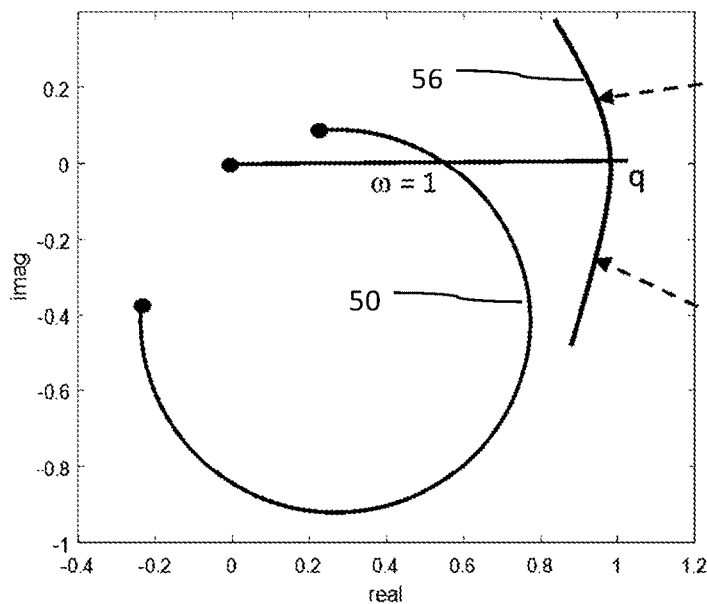
FIG. 17 is a single resonator operating contour showing that no instability results when the single resonator operating curve passing through q does not intersect the Nyquist contour.

Note that for lower Q enhancement, this instability mechanism does not occur as the constant radius circle clears the single resonator curve so that there is no point of intersection. This is illustrated in FIG. 17.

From the geometrical constructions in the previous figures, it is evident that if there is a resonator curve 50 that is approximately constant radius in the region of the device line intercept point that this instability cannot occur. Furthermore, the device curve and resonator curve will meet at right angles.

Sources of Phase Shift in the Single Resonator Tunable Filter

Two possible sources of phase shift of resonator curve 50 in the SRF include the varactor diode in resonator 14 and the active transistor or set of transistors used in ASB 18:

Varactor Diodes: One source of phase shift may be a resonator 14 with a varactor diode. The capacitance-voltage curve is generally convex such that for a given varactor bias as the signal amplitude grows the effective capacitance will increase. Hence the resonator frequency may decrease slightly. This will imply that the phase shift through resonator 14 will become more negative and result in a warping of the frequency mapping on the resonator Nyquist contour. Note that the increase in capacitance may cause the frequency phasor of the SRF or MRF to increase in magnitude.

Gain Elements: Another source of the phase shift increment with an increase in signal amplitude may be the gain amplifier. In the transistor devices, as the voltage swing of the signal increases, the transistor capacitances due to modulated charge depletion regions in the semiconductors may tend to increase slightly. This results in the gain amplifier AM-PM distortion which implies a larger phase shift as the amplifier is going into soft saturation.

Summarizing, in soft saturation the effective capacitance of various devices throughout AFBF circuit 11 will generally increase slightly with increase in signal amplitude. Hence there is a shift in the resonator curve that may cause the operating point q to be enclosed within the resonator loop resulting in Type II instability. These effects are discussed in the simulation described below.

Stability Considerations of an AFBF Based on the Tunable Multi-Resonator Filter (MRF)

As discussed above, the single resonator AFBF circuit 11 may remain stable with arbitrarily high Q enhancement, provided that resonator 14 is the only source of frequency dependence that contributes to $H_r(s)$. If there are other sources of frequency dependence such as the loop delay or the gain block 18, then $H_r(s)$ will change shape with changes in the varactor capacitance or transistor capacitance. This change in shape may result in the operating point being enclosed by the Nyquist contour, and a Type II instability occurs.

That may be coupled with the frequency dependence of the loop delay being corrected by detuning the resonator. However, detuning implies that the operating point is not at the maximum radius of the Nyquist contour and therefore the intersection of the resonator response and the device line is not orthogonal at the point of interception. Note that if operating point q is at the maximum radius point, then this is also a stationary point such that AM-PM distortion will have minor effects. Furthermore, gain block 18 cannot increase in amplitude with increased signal level which would imply instability of ASB 18 which is contrary to an assumption made. Also, as resonator 14 is passive, any AM-PM distortion will only result in the operating point separating from resonator response curve 50 and therefore no instability would result.

Figure 18:
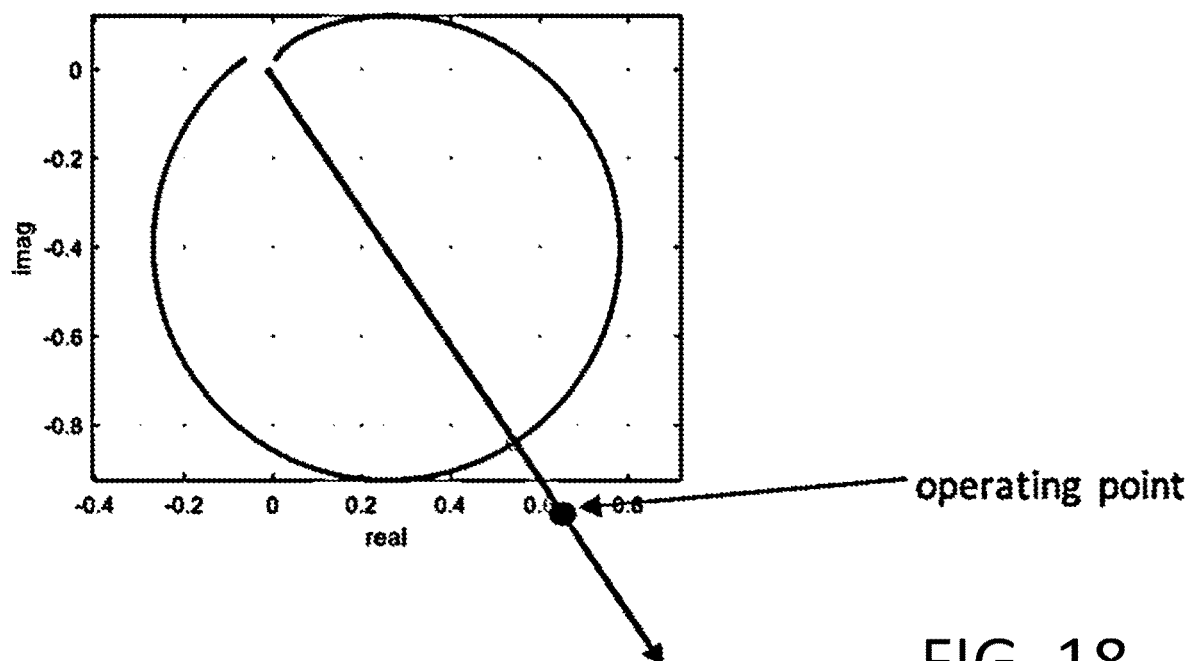
FIG. 18 is a resonator curve of a single resonator implementation with delay and phase shift.
Figure 19:
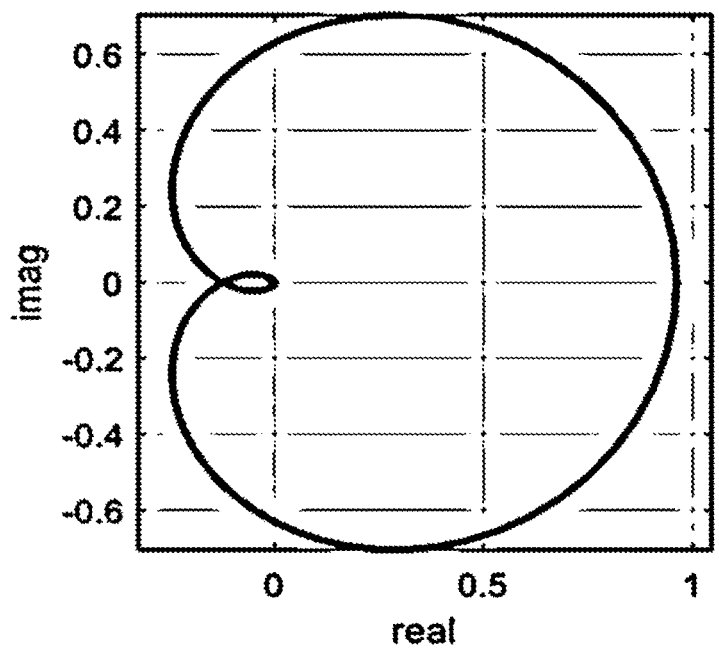
FIG. 19 is a resonator curve of a three resonator implementation.

Now suppose there is an AFBF circuit 11 with a delay as shown in FIG. 18 with a phase shift for G that goes through the desired tuning point. Then resonator 14 is tuned to the desired frequency and G is fitted with an appropriate phase shift. In this case it would need a positive phase shift of G.

As the device line passes through the maximum radius point there can be no instability. In order to generate the phase shift, a variable delay line may be used, but this may be difficult to integrate. A lumped LC line may be used, but this may require varactors and uncoupled inductors. The phase shifter may be constructed with multiple resonator 14 to make a bandpass phase shifter, and the resonators 14 may be made to be all the same to arrive at the multi-resonator MRF architecture shown in FIG. 3. Slight detuning of multiple resonators 14 will provide the phase shifting required.

Mitigation of Type II Instability in the Tunable Multi-Resonator Filter (MRF)

Consider the individual resonator represented as a transfer function as before:

$$H_{r,n}(\omega) = \frac{s\omega_n D}{s^2 + s\omega_n D + \omega_n^2}$$

where the subscript of n denotes the $n^{th}$ resonator, and that the overall MRF transfer function for a set of three resonators 14 is given by:

$$H_{ol}(\omega) = GH_{r,1}(\omega)H_{r,2}(\omega)H_{r,3}(\omega)$$

and where $\omega_n = \alpha\omega_{o,n}$, where $\omega_{o,n}$ are arbitrary constants and a is an arbitrary positive real variable. Then the shape of the Nyquist contour is invariant to changes in a. This is significant in that with the increase in signal level the effective varactor capacitance will vary approximately the same with every level of signal. But this only results in a frequency warping in the mapping along the Nyquist contour. This leads to a change in the location of the desired frequency as shown by the circle on the Nyquist contour of FIG. 19. Likewise if it is assumed that the bias voltage of the varactors is determined based on common voltage that is changed, then the change in this common voltage will result in the desired correction and put the desired frequency back on the device line.

The significance of this result is that there is no Type II instability associated with either the changes in the varactor voltage, or the changes in the input signal level as caused by varactor saturation. However, the passband will shift slightly with an increase in the signal voltage.

Mitigation of Multiple Device Intercept Points Resulting from Longer Delay Times Another problem does occur in AFBF circuit 11 with longer delays is that there may be multiple intercept points of the device line. This will lead to multiple Q enhanced passbands. A further issue is that the desired intercept point may be of slightly lower radius than undesired intercept points due to say a mild variation in the frequency response of the feedback loop which will limit the Q enhancement at the desired bandpass center frequency. This is illustrated in FIG. 20.

Figure 20:
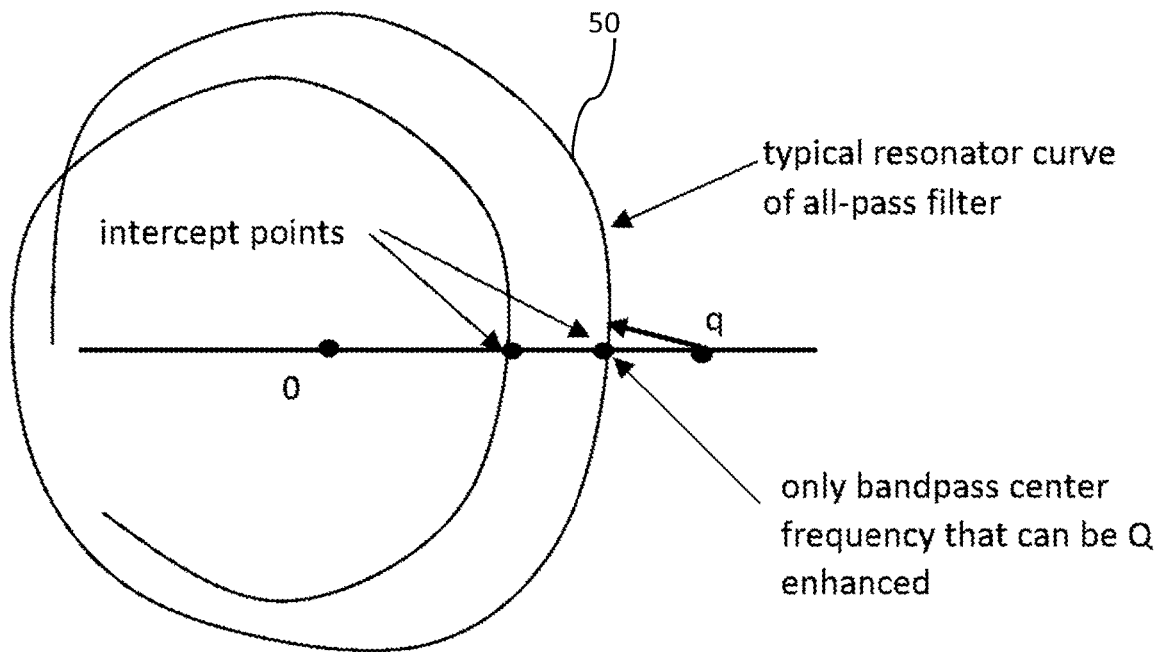
FIG. 20 is a resonator curve of a filter implementation of the all-pass phase shifter and the device line showing multiple intercept solutions with the device line are possible.

As observed in the illustration of FIG. 20, if Q is to enhance a specific bandpass center frequency it may be necessary to attenuate the resonator curve at other frequencies that are potential intercept points. Hence, the bandpass resonator in the feedback loop is provided, which is again the impetus for MRF block 16. The resonators 14 may each be tuned to the desired bandpass center frequency which emphasizes the frequencies in the neighborhood and attenuates frequencies outside this region. This ensures that the desired bandpass center frequency may always be Q enhanced without stability concern limitations. Hence an additional requirement of resonator curve 50 may be that the response has to fall off with frequency away from the neighborhood of $\omega_o$ such that multiple spurious bands are avoided or reduced.

Figure 21:
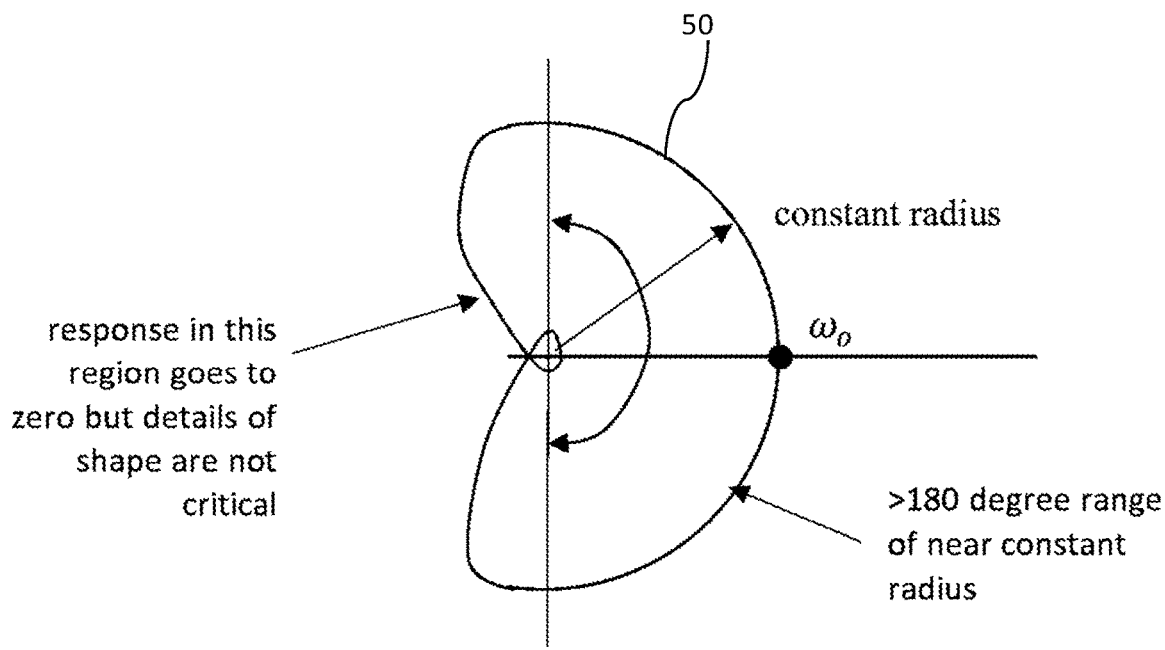
FIG. 21 is an implementable resonator curve with relaxed specifications.

An objective is to have resonator curve 50 be constant radius in the vicinity of the point of intersection, and then be reduced in radius for frequency points further away from the point of intersection. This is illustrated in FIG. 21. The reason for the desired requirement of constant radius in the vicinity of the point of intersection is that, if the maximum radius point is offset from the point of intersection, then there is no possibility of a Type II instability.

It should also be noted that feedback scaling block 20 may have either positive or negative gain and will in general be selectable as part of the loop configuration. Hence the device line may be either on the positive or negative real axis.

Multi-Resonator Filter Tuning to Provide Maximally Constant Resonator Curve Radius Over Region of Interest Various fundamental theorems known to those skilled in the art regarding passive systems would indicate that the desired resonator curve as in FIG. 21 may still be impossible to synthesize due to the constant radius portion. However, the constant radius may be well approximated over a moderate range. There is the design choice of the circuit architecture where phases of {0°,90°,180°, and 270° } can be used. With that the constant radius may only need to be well approximated over a 90 degree range.

Figure 22A:
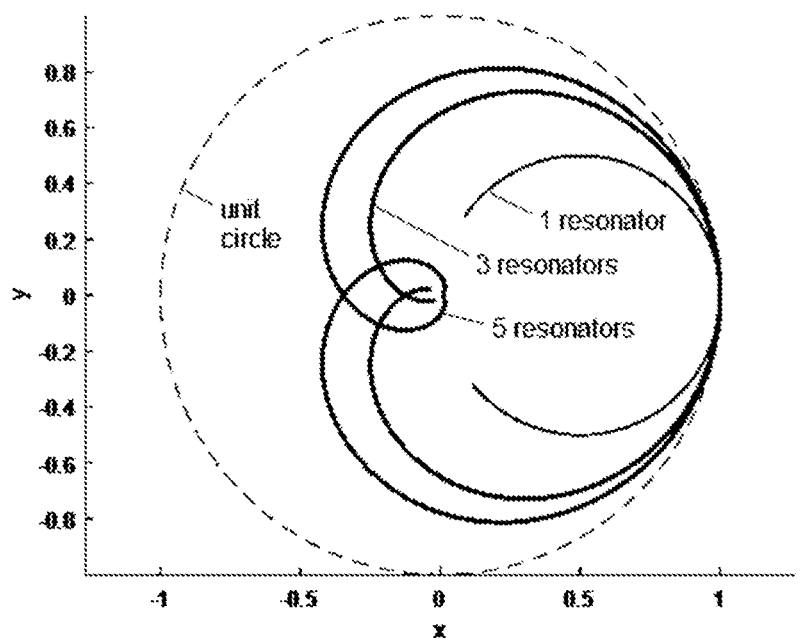
FIG. 22a is plot of resonator curves for 1-, 3-, and 5-resonator implementations.
Figure 22B:
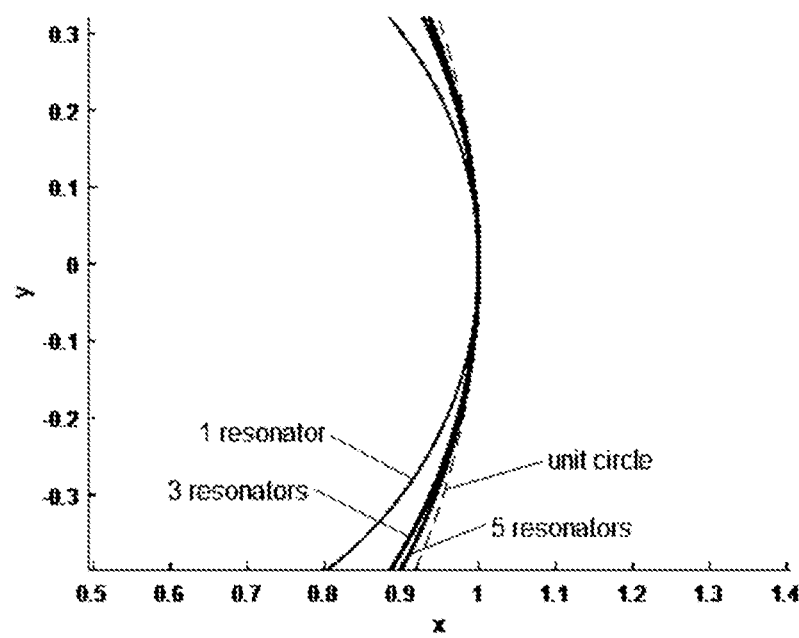
Figure 23:
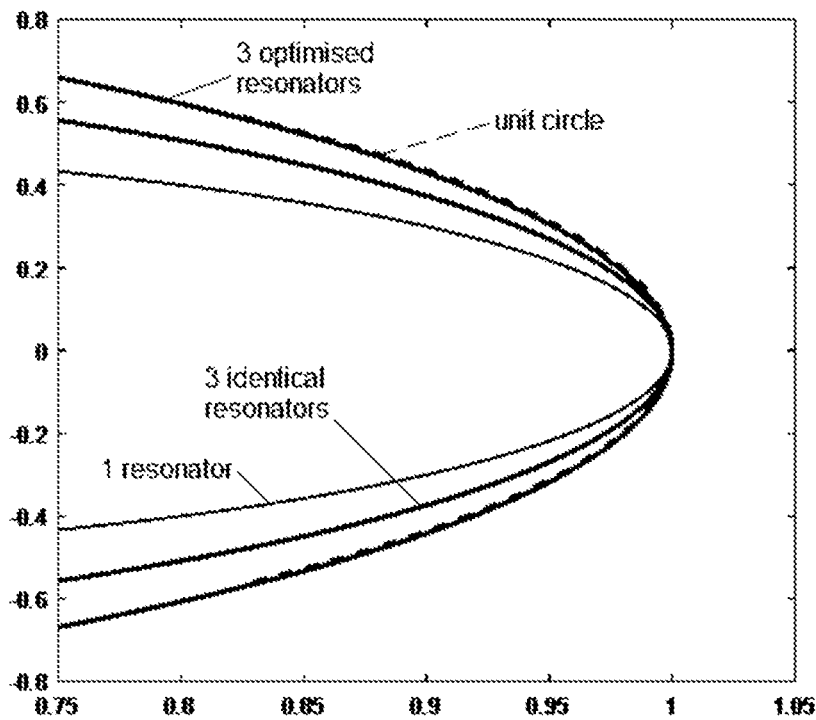
FIG. 23 is a plot of resonator curves corresponding to multiple resonators in series with various optimization schemes.

The following is an example of MRF block 16 where the resonators are tuned to provide a tuning curve with a maximally constant radius over a given angular arc around the point of intersection with the device line. Consider first an implementation of the multiple resonators in series all tuned to the same frequency. In FIG. 22a and FIG. 22b this is shown for 1, 3 and 5 resonators 14 in series. Clearly the resonator curve of three resonators in series can follow the constant radius criteria in the neighborhood of $\omega_o$ better than the single resonator. With five resonators, there is a further improvement but with diminishing returns related to an increase in control complexity.

It would seem as though there is little benefit in using more than 3 resonators. However, a better flatness may be achievable by using Butterworth-like tuning of the three poles to get a near constant radius resonator curve around the point of intersection. An example showing various optimization schemes is presented in FIG. 23.

Note that the 3-resonator curve may be optimized to follow the unit circle extremely closely, resulting in substantially orthogonal control and substantial elimination of the potential for instability. Note that the adjustment required of the resonators or detuning away from the desired bandpass center frequency is very small and hence, there is still the requirement that the overall bandpass response of the feedback that is implemented avoid multiple intercept points and interfere with the desired Q enhancement.

Figure 24:
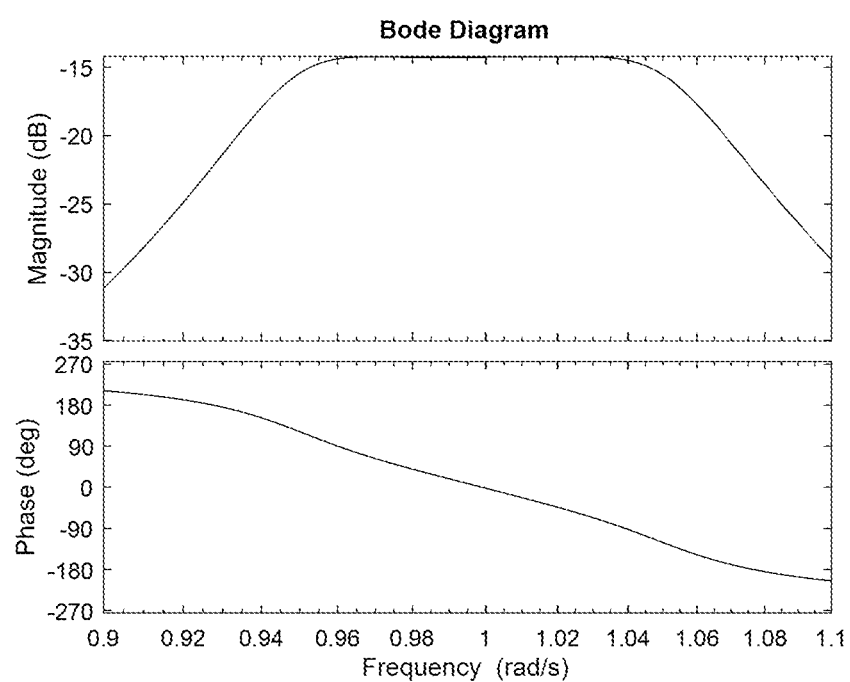
FIG. 24 is a Bode plot of the optimally tuned triple resonator open loop.

The bode plot of the optimally tuned triple resonator is given in FIG. 24. Note the maximally flat response within the passband of the open loop response.

Stability Conclusions
  a) Type II instability may be avoided by ensuring that the phasor of resonance curve 50 has a maximum magnitude at the point of intersection with device line 52.
  b) To provide robustness against a misalignment of the resonance curve intersection point and maximum phasor magnitude, a near constant radius in the vicinity of the point of intersection of resonance curve 50 is desired.
  c) To achieve the near constant radius condition, the Butterworth pole configuration of the MRF block 16 is configured, but this requires adjustment of the Q of the individual resonator poles in addition to the resonance frequency.
  d) Q adjustment of the individual resonators 14 may be achieved by a level 1 feedback in AFBF circuit 11 in addition to the commonly used level 2 feedback. This feedback scheme is illustrated in the embodiment shown in FIG. 25

Figure 25:
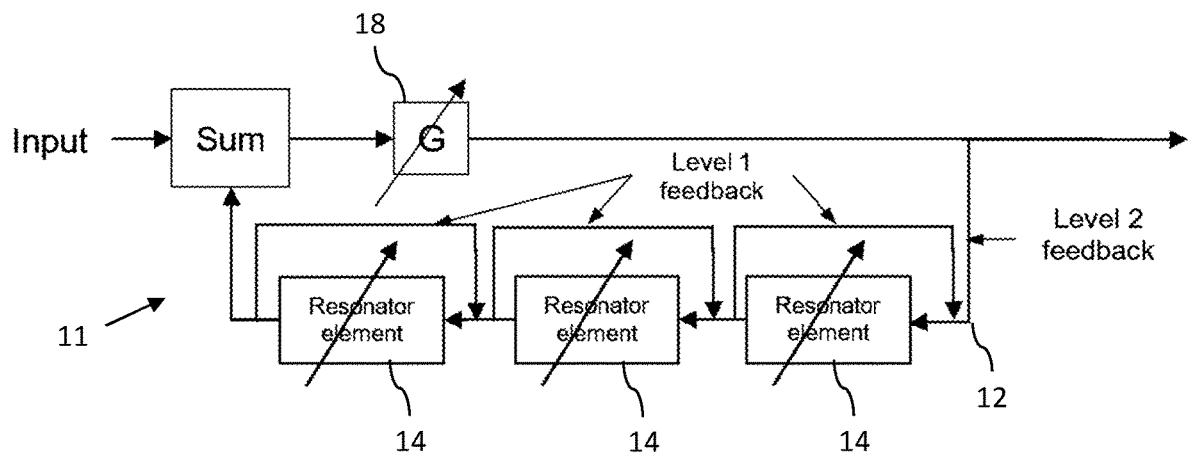
FIG. 25 is a AFBF circuit with 3 uncoupled resonators with Level 1 feedback within the resonator elements and Level 2 feedback with gain across the 3 uncoupled resonators.

Note that the desired maximally flat response may be achieved by correctly setting the relative Q amongst resonators 14. This relative Q may be set with adjusted Q spoiling which is much simpler to implement than a fully functional Level 1 feedback. This may be achieved, for example, using a field effect transistor (FET) across the resonator with a controlled bias. The FET behaves as a variable loss device and is relatively trivial to integrate. The method may involve initially tuning the feedback resonator poles very slightly in terms of Q (enhancement or spoiling) to get a maximally flat response for the overall resonator curve. Then the circuit is Q enhanced at the multi-resonator level with the level 2 feedback as shown in FIG. 25.

Note that in the Nielsen patent, it was stated that the level 1 feedback can be positive (enhancement), negative (spoiling) or zero (equivalent to having no level 1 feedback).

Single and Multiple Resonator Feedback Stability

In the previous sections, it was shown that the SRF provided an ideal resonator curve 50, provided that loop 12 consisted of a single resonator 14 without any parasitic delay and an active scaling block (ASB) 20 that was real-valued. In this configuration the resonator curve shape was invariant to frequency tuning of $w_r$ with only frequency warping occurring. There was no possibility of Type II instability as the intersection point of resonator curve 50 and device line 52 were at right angles. As such any phase shift due to larger signal soft saturation resulted in lower Q enhancement and hence would reduce the signal size. Furthermore, the orthogonal intersection implies orthogonal control with no cross coupling of frequency control and Q control.

Next the non-ideal parasitic delay was considered, which could be the physical propagation delay around the loop or delay in ASB 20. This rotated resonator curve 50 such that the intersection with device line 52 was not at right angles and resonator curve 50 shape was no longer invariant to changes in frequency tuning. To tune a Q modified bandpass filter to a desired center frequency requires significant detuning of the single resonator 14 resulting in non-orthogonal intersection of device line 52 and resonator curve 50. With soft saturation there will be a slight CCW rotation of the resonator curve 50 resulting in a Type II instability. Furthermore, the passband response is unsatisfactory as it is not symmetrical, and the non-orthogonal intersection implies that the center frequency control is coupled.

As detuning the single resonator 14 does not result in satisfactory results, a compensating phase shift may be added such that at the desired Q enhanced center frequency that the loop phase shift is a multiple of 360 degrees. Tunable phase shifts may be realized with variable delay lines, all pass filters, multiple resonators and using multiple frequency dependent ABSs 20. Of these possibilities, the implementation based on multiple resonators 14 is preferred, such as AFBF circuit 11 with MRF block 16 as discussed above.

It is recognized that it may be possible to individually tune the multiple resonators 14 of MRF block 16 to get a constant radius resonator curve 50 shape over a frequency region surrounding the desired center frequency. That is, given a parasitic delay in the feedback loop, the resonator poles may be tuned to provide a constant radius resonator curve 50 over an arc segment that includes the intersection point with device line 52.

In particular, the resonator poles may be tuned individually to meet the following criteria:
  a) The maximum magnitude of resonator curve 50 is at the point of intersection with device line 52; and
  b) Resonator curve 50 in the neighbourhood of the point of intersection is geometrically symmetrical.

Figure 26:
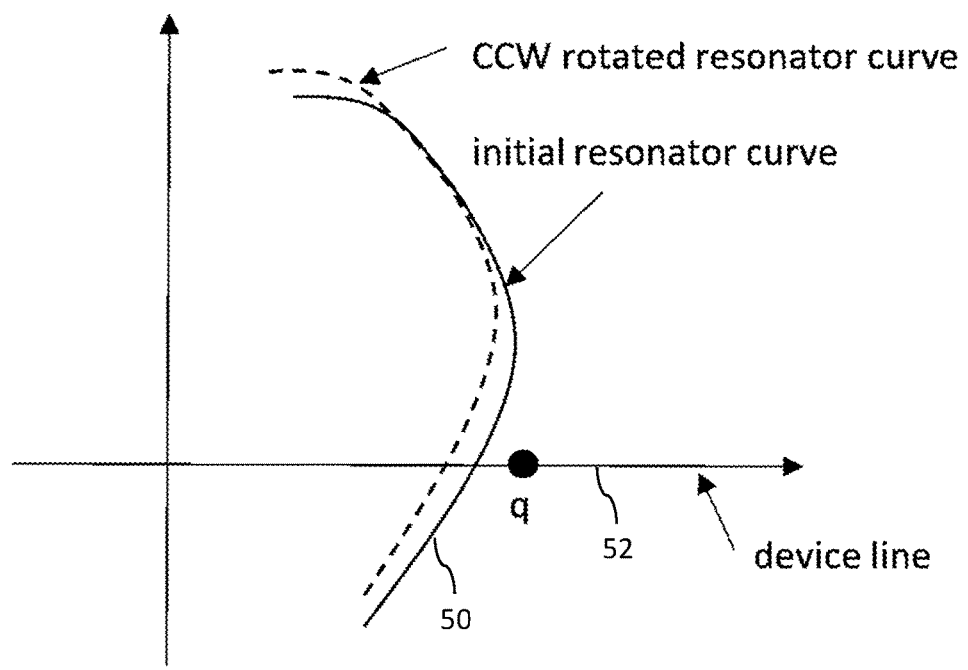
FIG. 26 is an illustration of the compromise resonator curve tuning to avoid Type II instability.
Figure 27:
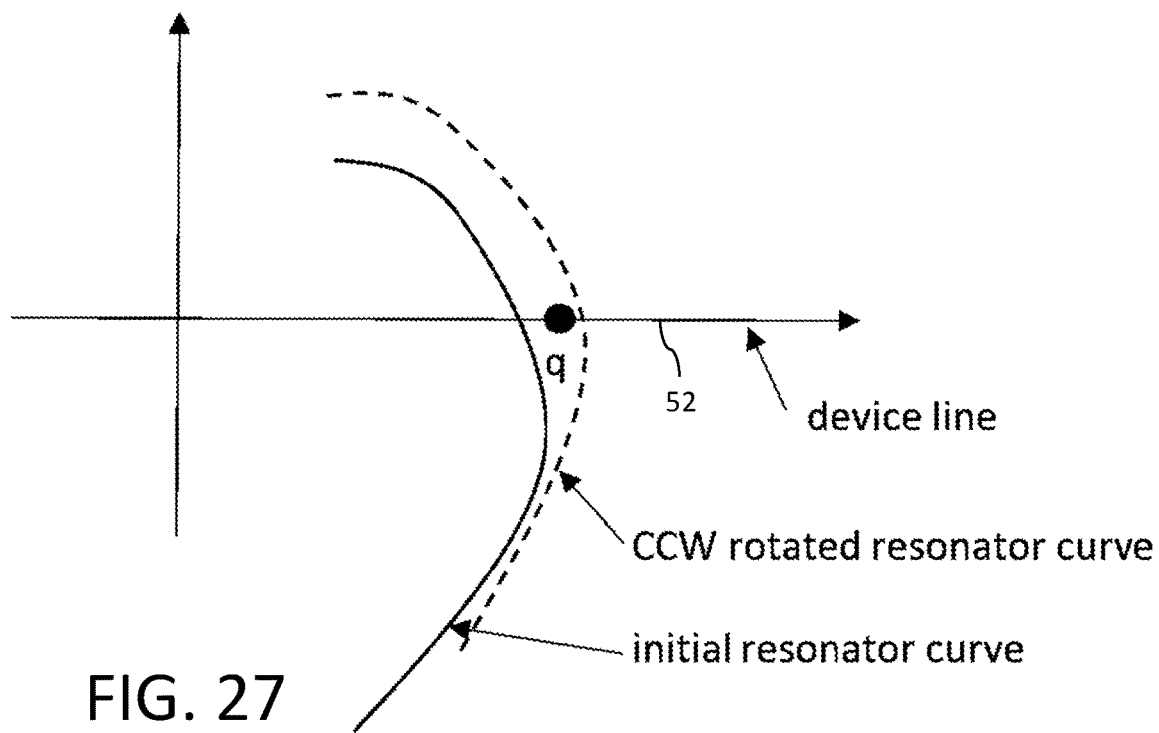
FIG. 27 is an illustration of the resonator curve tuning that results in the potential for Type II instability for high Q enhancement.

For large phase compensations it may be not possible to achieve a, which leads to the possibility of Type II instability. A compromise condition may be to adjust the MRF poles such that resonance curve 50, at the point of intersection with device line 52, is such that an incremental rotation of resonance curve 50 in the counterclockwise direction does not increase the radius of resonance curve 50 at the point of intersection. This is illustrated in FIG. 26. Note that an incremental CCW rotation, which will occur with slight soft saturation of varactor diodes, results in a decrease in Q enhancement and hence avoids the Type II instability. Conversely, if this condition is not satisfied and resonator curve 50 is as shown in FIG. 27, then soft saturation of the varactor diodes may lead to a Type II instability.

Note that the compromise MRF tuning that satisfies the criteria outlined may avoid the Type II instability which is critical to high Q enhancement operation. However, it does not result in orthogonal control which is desirable but not necessary. Non orthogonal control may complicate the control of AFBF circuit 11 and may make calibration more difficult.

Figure 28:
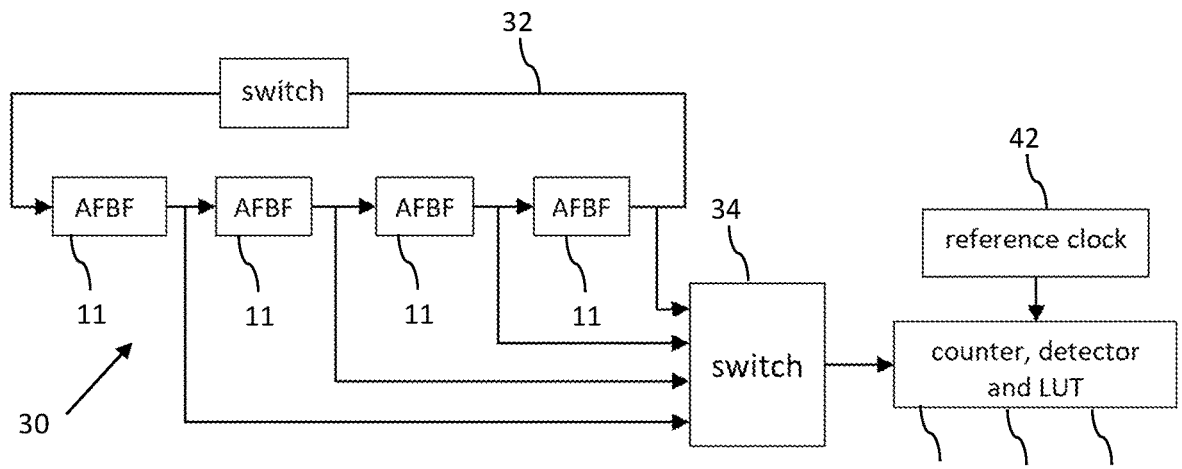
FIG. 28 is a block diagram of an AFBF circuit with multiple cascaded resonators.

Next consider the tuning of the AFBF circuit 11. FIG. 28 shows a multipole filter 30 that is realized from multiple, cascaded AFBF circuits 11. Additionally, there may be a feedback path 32 that is activated during calibration. Each AFBF circuit 11 output may be coupled to a switch 34 that connects to a frequency counter 36 and power detector 38.

Preferably, individual AFBF circuits 11 may be initially calibrated for generating a self-oscillation frequency that is tunable. Hence one AFBF circuit 11 may be active at a time and the feedback path may be disabled. In this way the AFBF circuit 11 may be characterized as a frequency tunable oscillator with calibration tuning data stored in a lookup table (LUT) 40. The counter component used in this process may be as accurate as a reference clock 42 provided. Next, one of the AFBF circuit 11 may be used as a source oscillator and another AFBF circuit 11 may be characterized. In the depicted example, AFBF circuit 11 is arranged in a way that the MRF blocks 16 are in the forward path of the AFBF circuit 11 and that the feedback path in each AFBF circuit 11 may be disabled such that the forward path of the AFBF circuit 11 may be characterized directly. Detector 38 is used to characterize the radius of MRF block 16 response of the AFBF circuit 11 as a function of frequency. The phase of MRF block 16 is not directly measurable as the self-oscillating AFBF circuit 11 used to source the test signal is asynchronous.

However, as the structure of MRF block 16 may be modelled as a set of resonators 14 and transport delay and given a known resonator 14 structure and approximate characterization, the phase may be inferred from the amplitude of the MRF block 16 response. This is based on linear time invariant (LTI) network theory wherein the phase and amplitude response of MRF block 16 are related. Hence actual phase measurements of MRF block 16 may be redundant in such circumstances. Accordingly, an amplitude measurement of MRF block 16 network as a function of excitation frequency may be sufficient for characterizing the complex valued resonator curve 50 of AFBF circuit 11 for a given control setting.

Having characterized resonator curve 50 then allows it to be optimized such that the desired characteristics outlined above may be achieved. The result is the ability to tune MRF block 16 for stability for an arbitrarily high Q enhancement and orthogonal control.

It should be noted that Q control of AFBF circuit 11 is then the direct variation of ASB 18 value which is typically implemented by an adjustable attenuator. The frequency control applies the same relative change to all of resonators 14 of MRF block 16.

Figure 29:
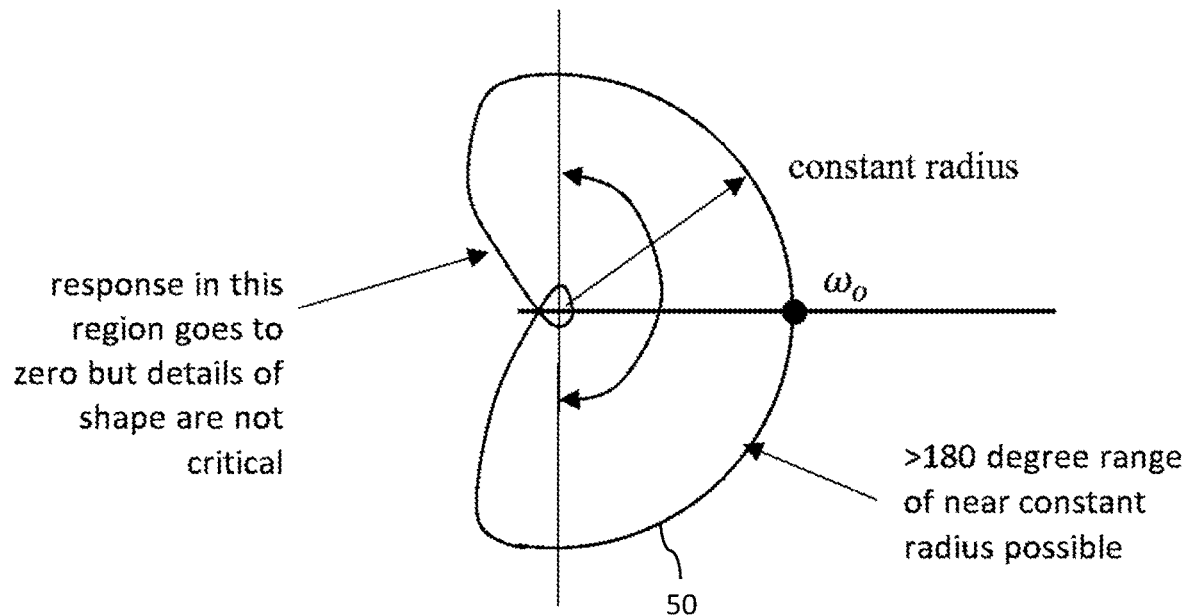
FIG. 29 is an implementable Nyquist resonator contour with relaxed specifications.

FIG. 29 illustrates resonance curve 50 that has constant radius. This is one possible MRF block 16 tuning variant.

Resonance curve 50 may be tuned such that the phasor of resonance curve 50 has a maximum magnitude at the point of intersection with device line 52 in order to avoid the Type II instability. This then leads to the following:

a) Robustness may be enhanced by making the radius of resonator curve 50 nearly constant in the vicinity of the point of intersection of resonance curve 50 as desired.
b) This may be implemented by tuning the poles of MRF block 16 to correspond to a Butterworth pole configuration.
c) Q spoiling/enhancing is needed for this stability, as the Q of the poles of the Butterworth pole configuration vary. This may be achieved by a level 1 feedback in AFBF circuit 11. However, to minimize circuit complexity, Q spoiling may be used based on a single FET operated as a variable resistor loss element in conjunction with resonators 14.

As used above, the term orthogonality is generally used to describe an intersection of lines at 90 degrees in Cartesian coordinates. Typically, this term is used with reference to operating or device lines plotted in an s-plane, either relative to each other, or an axis, such as the real axis, of the s-plane. It will be understood that, in practice, an approximation of orthogonality will often be sufficient, such as within a predetermined operating range related to a range of frequencies, values of Q, or combination thereof. As such, when referring to the intersection of lines as being orthogonal, this may also include intersections that are near orthogonal, or are operationally orthogonal, meaning that they may be approximated as orthogonal as the results obtained are sufficiently close to those that would be obtained by precisely orthogonal lines. As such, whether lines are sufficiently orthogonal may be based on the intended operating range of the circuit, such as may be required to achieve stability as described herein.

Simulation of Phase Shift for Large Signal Levels

As noted above with respect to the Type II stability, large signal levels may result in non-linear effects related to phase shifts. There will now be described an example of the effect that large signal levels may have on the phase shift in a signal loop.

Figure 30:
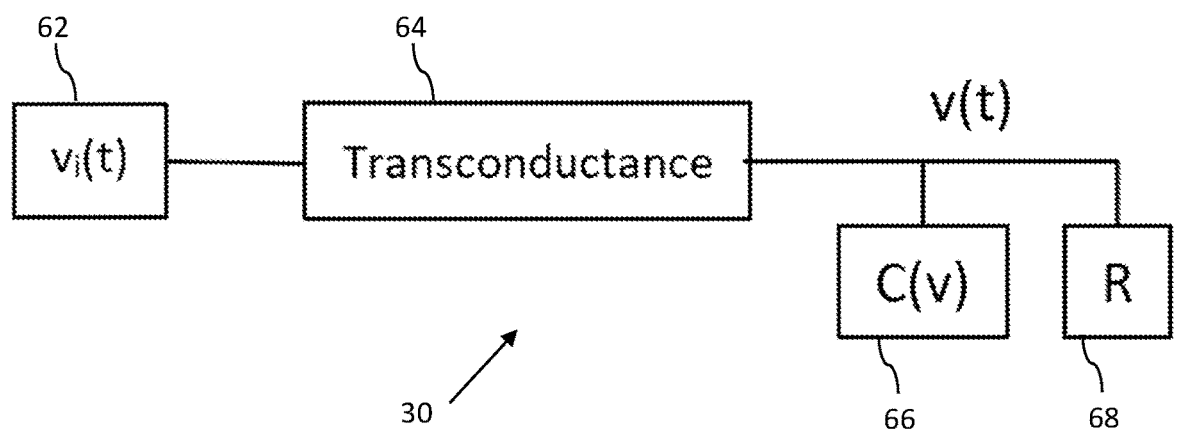
FIG. 30 is a simple simulation circuit of a voltage dependent capacitance.

Suppose there is a generic transistor gain stage 60 in a configuration as in FIG. 30. Here vi(t) is an input signal 62 and the transistor is modelled as a transconductance 64. The output load is a capacitor 66 that is a function of the voltage in parallel with a resistor 68. For this circuit select R=1 and C(v) is $$C(v)=C_o+av+bv^2$$

Figure 31:
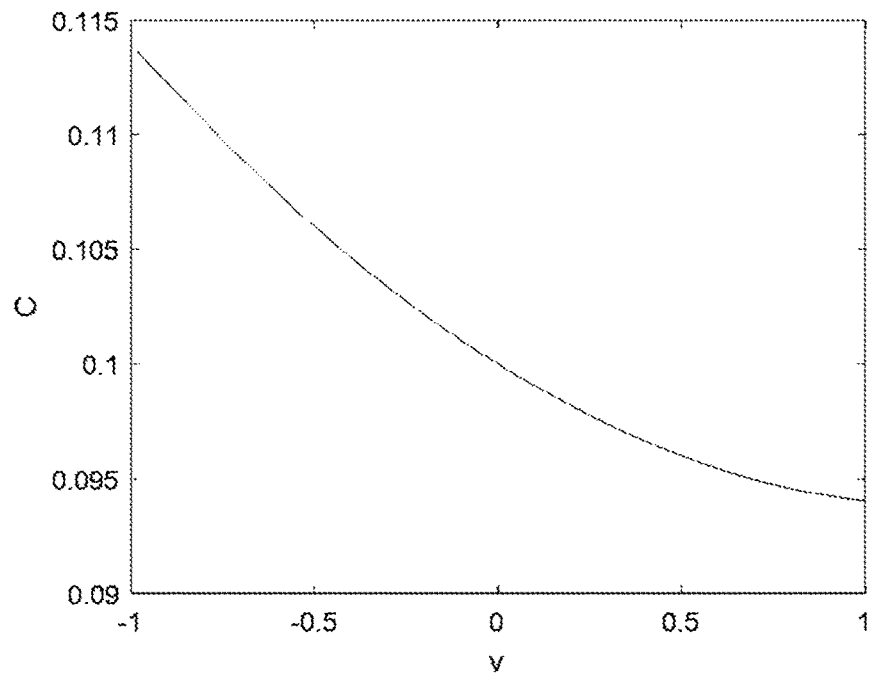
FIG. 31 is a plot of capacitance value as a function of voltage.

The capacitance for a=−0.01 and b=0.004 is shown in FIG. 31 which gives a convex capacitor function vs voltage which is typical of an actual capacitance associated with a varactor diode or some depletion layer capacitance in the transistor.

Figure 32:
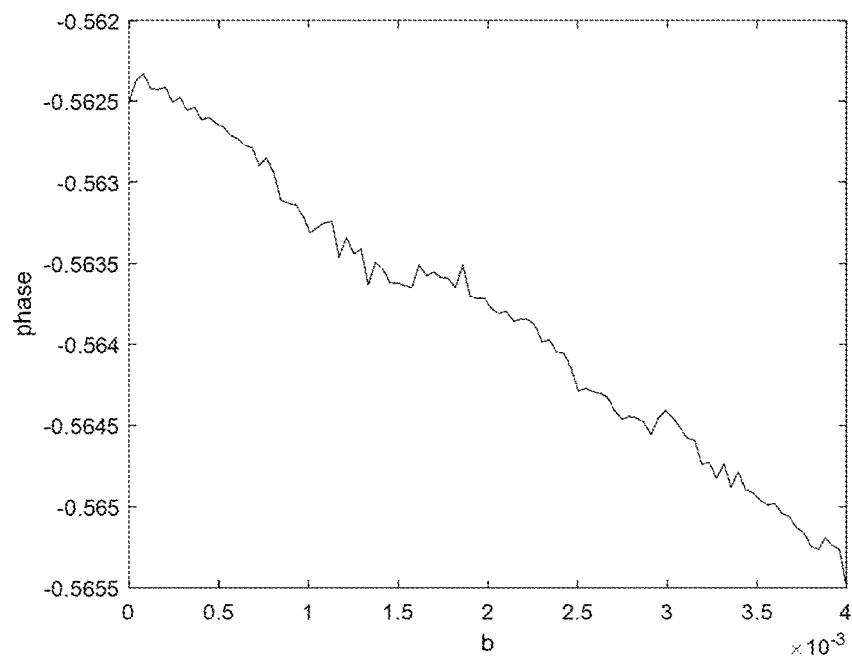
FIG. 32 is a plot of phase shift of the circuit of FIG. 30.

In FIG. 32 the resulting phase shift of the output voltage relative to the input voltage as a function of the constant b is shown. Hence as the curvature of capacitor 66 value increases there is an increased phase shift. This is reasonable as it is easily observed that the average capacitance increases with increase in convex curvature.

Figure 33:
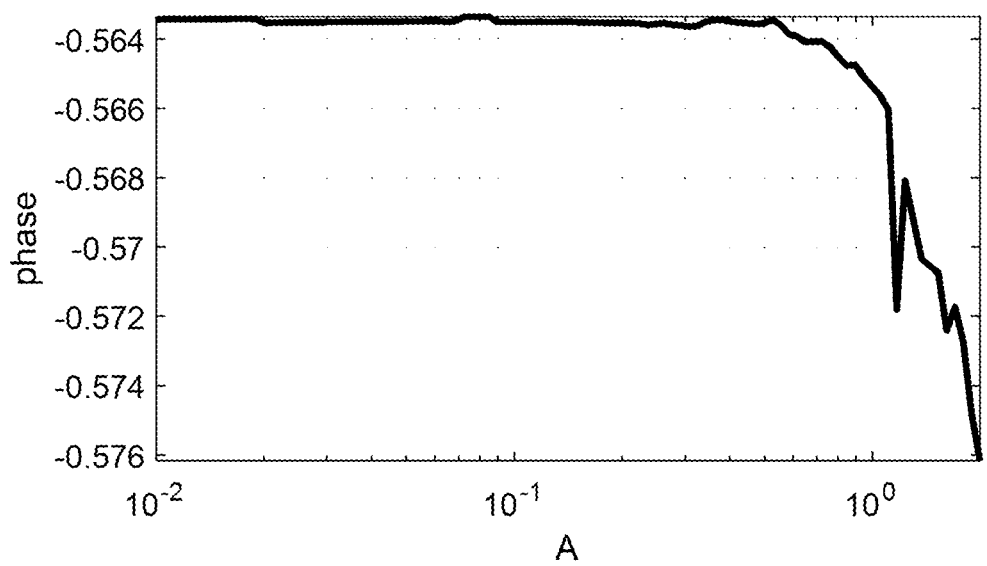
FIG. 33 is a plot of phase shift as a function of the input signal amplitude.

Next consider the phase shift as a function of the input signal 62 amplitude, shown in FIG. 33. This is done for a=−0.01 and b=0.004. Note that the phase shift becomes more negative which is also expected from the convex capacitance versus voltage curve which indicates that the average capacitance increases with increased signal level.

To summarize, the stability of the variable filter may be maintained within an operating range by controlling the adjustable resonator and the adjustable gain block such that, in the Cartesian s-plane, the resonator response curve satisfies an orthogonality stability condition. Such an orthogonality stability condition may include, for example, a constant or nearly constant radius circle that encompasses the resonator response curve, that is centered on the origin, and that passes through the operating point; a resonator curve that is orthogonal or nearly orthogonal to the real axis where the resonator response curve crosses the real axis; and/or a frequency control and response Q control that are orthogonal or nearly orthogonal.

In this patent document, the word "comprising" is used in its non-limiting sense to mean that items following the word are included, but items not specifically mentioned are not excluded. A reference to an element by the indefinite article "a" does not exclude the possibility that more than one of the elements is present, unless the context clearly requires that there be one and only one of the elements.

The scope of the following claims should not be limited by the preferred embodiments set forth in the examples above and in the drawings, but should be given the broadest interpretation consistent with the description as a whole.

The invention claimed is:

1. A method of stabilizing a variable filter for an analog electromagnetic signal against circuit oscillation, the method comprising the steps of:
providing a signal loop comprising a signal input, a signal output, and a plurality of variable circuit elements connected in the signal loop, the plurality of variable circuit elements comprising an adjustable resonator and an adjustable gain block, the signal loop having a variable frequency response that is characterized by a central frequency, a frequency passband, a response Q, and an operating point and a resonator response curve that are plottable in a Cartesian s-plane having an origin, a real axis, and an imaginary axis;
maintaining stability of the variable filter within an operating range by controlling the adjustable resonator and the adjustable gain block such that, in the Cartesian s-plane, the resonator response curve satisfies an orthogonality stability condition.

2. The method of claim 1, wherein the orthogonality stability condition comprises a constant or nearly constant radius circle within the operating range that encompasses the resonator response curve, that is centered on the origin, and that passes through the operating point.

3. The method of claim 1, wherein the orthogonality stability condition comprises the resonator curve being orthogonal or nearly orthogonal to the real axis where the resonator response curve crosses the real axis.

4. The method of claim 1, wherein the orthogonality stability condition comprises the frequency control being orthogonal or nearly orthogonal to the response Q control.

5. The method of claim 1, wherein the signal loop further comprises an adjustable phase control element, and wherein maintaining stability further comprises controlling the adjustable phase control element to achieve a desired phase of the signal loop.

6. The method of claim 5, wherein the desired phase of the signal loop comprises a phase adjustment of at least 90 degrees.

7. The method of claim 5, comprising a plurality of adjustable resonators connected in series, and wherein the adjustable phase control element comprises the plurality of adjustable resonators.

8. The method of claim 7, wherein the adjustable resonator and the adjustable phase control element are adjusted in an iterative process to arrive at a desired central frequency with a desired response Q and to maintain stability against circuit oscillation.

9. The method of claim 7, wherein the adjustable gain block is controlled and the plurality of adjustable resonators are individually controlled such that the resonator curve has a near constant radius within the operating range.

10. The method of claim 9, wherein the plurality of adjustable resonators are controlled individually to achieve a desired bandwidth of the passband of the signal loop.

11. The method of claim 10, wherein the plurality of adjustable resonators are adjusted such that a resonator response curve contour of the variable filter has a constant or near constant radius around the real axis in the s-plane.

12. The method of claim 10, wherein the signal loop comprises a signal path and a feedback path between the signal input and the signal output, the plurality of adjustable resonators being connected in series in the signal path, the method comprising the step of calibrating the variable filter by:
connecting a switch between the output of each adjustable resonator and a counter and a detector;
with the feedback path open, using the counter and the detector to characterize a Nyquist contour for each adjustable resonator; and
calibrating one or more adjustable downstream resonators using an upstream resonator as a sinusoidal excitation source.

13. The method of claim 12, wherein each variable filter comprises an active feedback bandpass filter.

14. The method of claim 12, wherein a phase of the signal loop is inferred from a measured amplitude response by the detector based on a calculation.

15. The method of claim 12, wherein the adjustable gain block is connected in the feedback path and is controlled to Q spoil the signal loop such that the resonator response curve comprises a near constant radius response adjacent to a point of intersection with the device line.

16. The method of claim 1, wherein the operating range comprises a predetermined passband frequency range about a desired central frequency.

17. The method of claim 1, wherein the operating range comprises a desired response Q.

18. The method of claim 1, wherein the signal loop comprises a plurality of adjustable resonators.

* * * * *